(12) United States Patent
Bowering

(10) Patent No.: US 7,309,871 B2
(45) Date of Patent: Dec. 18, 2007

(54) COLLECTOR FOR EUV LIGHT SOURCE

(75) Inventor: Norbert Bowering, San Diego, CA (US)

(73) Assignee: Cymer, Inc., San Diego, CA (US)

(*) Notice: Subject to any disclaimer, the term of this patent is extended or adjusted under 35 U.S.C. 154(b) by 0 days.

(21) Appl. No.: 11/603,732

(22) Filed: Nov. 21, 2006

(65) Prior Publication Data

US 2007/0114470 A1 May 24, 2007

Related U.S. Application Data

(60) Division of application No. 10/798,740, filed on Mar. 10, 2004, now Pat. No. 7,217,940, which is a continuation-in-part of application No. 10/409,254, filed on Apr. 8, 2003, now Pat. No. 6,972,421.

(51) Int. Cl.
*H01J 35/20* (2006.01)

(52) U.S. Cl. .............................. 250/504 R; 250/505.1

(58) Field of Classification Search ............ 250/504 R, 250/505.1, 493.1; 378/119
See application file for complete search history.

(56) References Cited

U.S. PATENT DOCUMENTS

| | | | |
|---|---|---|---|
| 2,759,106 A | 8/1956 | Wolter | 250/53 |
| 3,150,483 A | 9/1964 | Mayfield et al. | 60/35.5 |
| 3,232,046 A | 2/1966 | Meyer | 50/35.5 |
| 3,279,176 A | 10/1966 | Boden | 60/202 |
| 3,746,870 A | 7/1973 | Demarest | 250/227 |
| 3,960,473 A | 6/1976 | Harris | 425/467 |
| 3,961,197 A | 6/1976 | Dawson | 250/493 |
| 3,969,628 A | 7/1976 | Roberts et al. | 250/402 |
| 4,042,848 A | 8/1977 | Lee | 313/231.6 |

(Continued)

FOREIGN PATENT DOCUMENTS

EP     1211918     10/2001

(Continued)

OTHER PUBLICATIONS

Apruzese, J.P., "X-Ray Laser Research Using Z. Pinches," *Am. Inst. Of Phys.* 399-403, (1994).

(Continued)

*Primary Examiner*—Kiet T. Nguyen
(74) *Attorney, Agent, or Firm*—William Cray

(57) ABSTRACT

An apparatus/method may comprise, a multi-layer reflecting coating forming an EUV reflective surface which may comprise an inter-diffusion barrier layer which may comprise a carbide selected from the group ZrC and NbC or a boride selected from the group $ZrB_2$ and $NbB_2$ or a disilicide selected from the group $ZrSi_2$ and $NbSi_2$ or a nitride selected from the group BN, ZrN, NbN, BN, ScN and $Si_3N_4$. The apparatus and method may comprise an EUV light source collector which may comprise a collecting mirror which may comprise a normal angle of incidence multi-layer reflecting coating; an inter-diffusion barrier layer comprising a material selected from the group comprising a carbide selected from the group ZrC and NbC, or a boride selected from the group $ZrB_2$ and $NbB_2$ or a disilicide selected from the group $ZrSi_2$ and $NbSi_2$ a nitride selected from the group BN, ZrN, NbN, BN, ScN and $Si_3N_4$.

51 Claims, 29 Drawing Sheets

U.S. PATENT DOCUMENTS

| | | | |
|---|---|---|---|
| 4,088,966 A | 5/1978 | Samis | 313/231.5 |
| 4,143,275 A | 3/1979 | Mallozzi et al. | 250/503 |
| 4,162,160 A | 7/1979 | Witter | 75/246 |
| 4,203,393 A | 5/1980 | Giardini | 123/30 |
| 4,408,338 A | 10/1983 | Grobman | 378/34 |
| 4,504,964 A | 3/1985 | Cartz et al. | 378/119 |
| 4,536,884 A | 8/1985 | Weiss et al. | 378/119 |
| 4,538,291 A | 8/1985 | Iwamatsu | 378/119 |
| 4,596,030 A | 6/1986 | Herziger et al. | 378/119 |
| 4,618,971 A | 10/1986 | Weiss et al. | 378/34 |
| 4,626,193 A | 12/1986 | Gann | 431/71 |
| 4,633,492 A | 12/1986 | Weiss et al. | 378/119 |
| 4,635,282 A | 1/1987 | Okada et al. | 378/34 |
| 5,963,616 A | 10/1999 | Silfvast et al. | 378/122 |
| 6,031,241 A | 2/2000 | Silfvast et al. | 250/504 |
| 6,039,850 A | 3/2000 | Schulz | 204/192.15 |
| 6,051,841 A | 4/2000 | Partlo | 250/504 |
| 6,064,072 A | 5/2000 | Partlo et al. | 250/504 |
| 6,172,324 B1 | 1/2001 | Birx | 219/121.57 |
| 6,178,221 B1 | 1/2001 | Levinson et al. | 378/119 |
| 6,195,272 B1 | 2/2001 | Pascente | 363/21 |
| 6,285,743 B1 | 9/2001 | Kondo et al. | 378/119 |
| 6,307,913 B1 | 10/2001 | Foster et al. | 378/34 |
| 6,377,651 B1 | 4/2002 | Richardson et al. | 378/34 |
| 6,392,792 B1 | 5/2002 | Naulleau | 359/360 |
| 6,396,900 B1 | 5/2002 | Barbee, Jr. et al. | 378/84 |
| 6,566,668 B2 | 5/2003 | Rauch et al. | 250/504 |
| 6,576,912 B2 | 6/2003 | Visser et al. | 250/492.2 |
| 6,586,757 B2 | 7/2003 | Melnychuk et al. | 250/504 |
| 6,590,959 B2 | 7/2003 | Kandaka et al. | 378/119 |
| 6,635,844 B2 | 10/2003 | Yu | 219/121.68 |
| 6,647,086 B2 | 11/2003 | Ameniya et al. | 378/34 |
| 6,744,060 B2 | 6/2004 | Ness et al. | 250/504 |
| 6,804,327 B2 | 10/2004 | Schriever et al. | 378/119 |
| 6,815,700 B2 | 11/2004 | Melynchuk et al. | 250/504 |
| 6,865,255 B2 | 3/2005 | Richardson | 378/119 |
| 7,193,228 B2 * | 3/2007 | Bowering et al. | 250/504 R |
| 2002/0171922 A1 | 11/2002 | Shiraishi et al. | 359/359 |

FOREIGN PATENT DOCUMENTS

| | | |
|---|---|---|
| TW | 505978 | 10/2002 |
| TW | 511139 | 11/2002 |

OTHER PUBLICATIONS

Bollanti, et al, "Compact Three Electrodes Excimer Laser IANUS For A POPA Optical System," *SPIE Proc.* (2206) 144-153, (1994).

Bollanti, et al, "Innus, The Three-Electrode Excimer Laser," *App. Phys. B (Lasers & Optics)* 66(4):401-406,(1998).

Braun, et al, "Multi-component EUV Multilayer Mirrors," *Proc. SPIE*, 5037:2-13, (2003).

Choi, et al, "A $10^{13}$ A/s High Energy Density Micro Discharge Radiation Source," *B. Radiation Characteristics*, p. 287-290.

Choi, et al, "Fast Pulsed Hollow Cathode Capillary Discharge Device." *Rev. of Sci. Instrum.* 69(9):3118-3122 (1998).

Eckstein, "Calculated Sputtering, Reflection and Range Values," Jun. 24, 2002.

Feigl, et al, "Heat Resistance of EUV Multilayer Mirrors For Long-Time Applications," *Microelectric Engineering*, 57-58:3-8, (2001).

Fomenkov, et al, "Characterization of A 13.5nm Source For EUV Lithography Based On A Dense Plasma Focus and Lithium Emission," *Sematech Intl. Workshop On EUV Lithography*, (Oct. 1999).

Hansson, et al, "Xenon Liquid Jet Laser-Plasma Source For EUV Lithography," *Emerging Lithographic Technologies IV, Proc. Of SPIE*, vol. 3997:729-732 (2000).

Hopwood, "Ion Bombardment Energy Distributions In A Radio Frequency Induction Plasma," *Appl. Phys. Lett.* (9) pp. 940-942, (Mar 1, 1993).

Kato, Yasuo, "Electrode Lifetimes In A Plasma Focus Soft X-Ray Source," *J. Appl. Phys.* (33) Pt. 1, No. 8:4742-4744 (1991).

Kato, et al, "Plasma Focus X-Ray Source For Lithography," *Am. Vac. Sci. Tech. B.*, 6 (1): 195-198 (1988).

Lebert, et al, Soft X-Ray Emissions of Laser-Produced Plasmas Using A Low-Debris Cryogenic Nitrogen.

Lebert, et al, "A Gas Discharged Based Radiation Source For EUV-Lithography," *Intl. Conf. Micro and Nano-*.

Lebert, et al, "Investigation of Pinch Plasmas With Plasma Parameters Promising ASE," *Inst. Phys. Conf.* Ser.

Lebert, et al, "Comparison of Laser Produced and Gas Discharge Based EUV Sources for Different Applications," *Intl. Cont. Micro- and Nano-Engineering 98* (Sep. 22-24, 1998) Leuven, Belgium.

Lee, Ja H., "Production of Dense Plasmas In Hypocycloidal Pinch Apparatus," *The Phys. Of Fluids*, 20 (2):313-321 (1977).

Lewis, Ciarnn L.S., "Status of Collision-Pumped X-Ray Lasers," *Am. Inst. Phys.* pp. 9-16 (1994).

Malmqvist, et al., "Liquid-jet target for laser-plasma soft x-ray generation," *Am. Inst. Phys.* 67(12):4150-4153 1996).

Mather, et al., "Stability of the Dense Plasma Focus," *Phys. Of Fluids*, 12(11):2343-2347 (1969).

Mayo, et al., "A magnetized coaxial source facility for the generation of energetic plasma flows," *Sci. Technol*, vol. 4:pp. 47-55 (1994).

Mayo, et al., "Initial Results on high enthalpy plasma generation in a magnetized coaxial source," *Fusion Tech* vol. 26:1221-1225 (1994).

Nilsen, et al., "Analysis of resonantly photopumped Na-Ne x-ray-laser scheme," *Am Phys. Soc.* 44(7):4591-4597 (1991).

Partlo, et al., "EUV (13.5nm) Light Generation Using a Dense Plasma Focus Device," *SPIE Proc. On Emerging Lithographic Technologies III*, vol. 3676, 846-858 (Mar. 1999).

Porter, et al., "Demonstration of Population Inversion by Resonant Photopumping in a Neon Gas Cell Irradiated by a Sodium Z Pinch," *Phys. Rev. Let*, 68(6):796-799, (Feb. 1992).

Price, Robert H., "X-Ray Microscopy using Grazing Incidence Reflection Optics," *Am. Inst. Phys.*, pp. 189-199, (1981).

Qi, et al., "Fluorescence in Mg IX emission at 48.340 Å from Mg pinch plasmas photopumped by Al XI line radiation at 48.338 Å," *The Am. Phys. Soc.*, 47(3):2253-2263 (Mar. 1993).

Scheuer, et al., "A Magnetically-Nozzled, Quasi-Steady, Multimegawatt, Coaxial Plasma Thruster," *IEEE: Transactions on Plasma Science*, 22(6) (Dec. 1994).

Schriever, et al., "Laser-produced lithium plasma as a narrow-band extended ultraviolet radiation source for photoelectron spectroscopy," *App. Optics*, 37(7):1243-1248, (Mar. 1998).

Schriever, et al., "Narrowband laser produced extreme ultraviolet sources adapted to silicon/molybdenum multilayer optics," *J. of App. Phys.*, 83(9):4566-4571, (May 1998).

Silfvast, et al., "High-power plasma discharge source at 13.5 nm and 11.4 nm for EUV lithography," *SPIE*, vol. 3676:272-275, (Mar. 1999).

Silfvast, et al., "Lithium hydride capillary discharge creates x-ray plasma at 13.5 namometers," *Laser Focus World*, p. 13, (Mar. 1997).

Wilhein, et al., "A slit grating spectrograph for quantitative soft x-ray spectroscopy," *Am. Inst. Of Phys. Rev. of Sci. Instrum.*, 70(3):1694-1699, (Mar. 1999).

Wu, et al., "The vacuum Spark and Spherical Pinch X-ray/EUV Point Sources," *SPIE Conf. On Emerging Tech. III*, Santa Clara, CA, vol. 3676:410-420, (Mar. 1999).

Zombeck, M.V., "Astrophysical Observations with High Resolution X-ray Telescope," *Am. Inst. Of Phys.*, pp. 200-209, (1981).

* cited by examiner

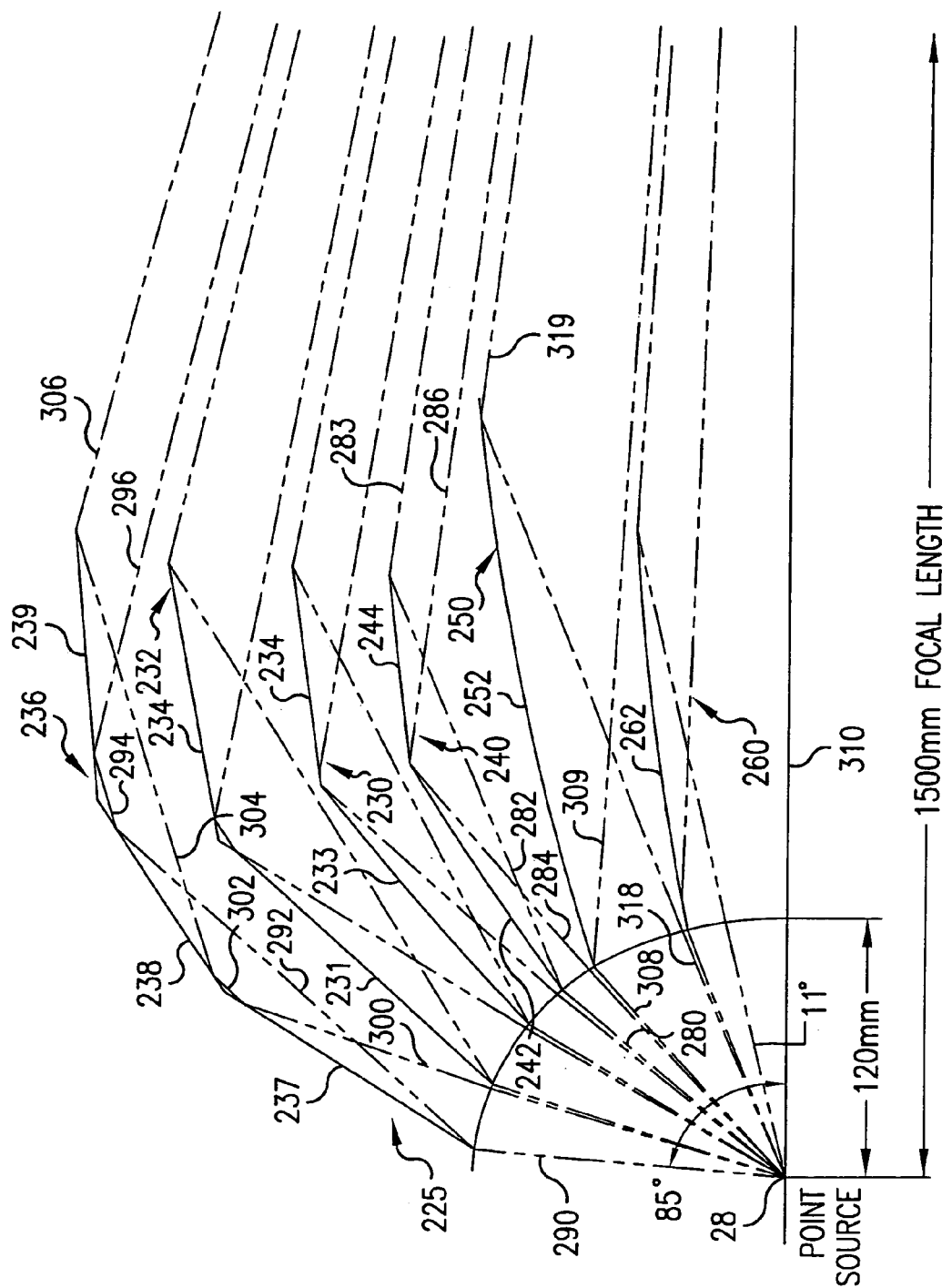

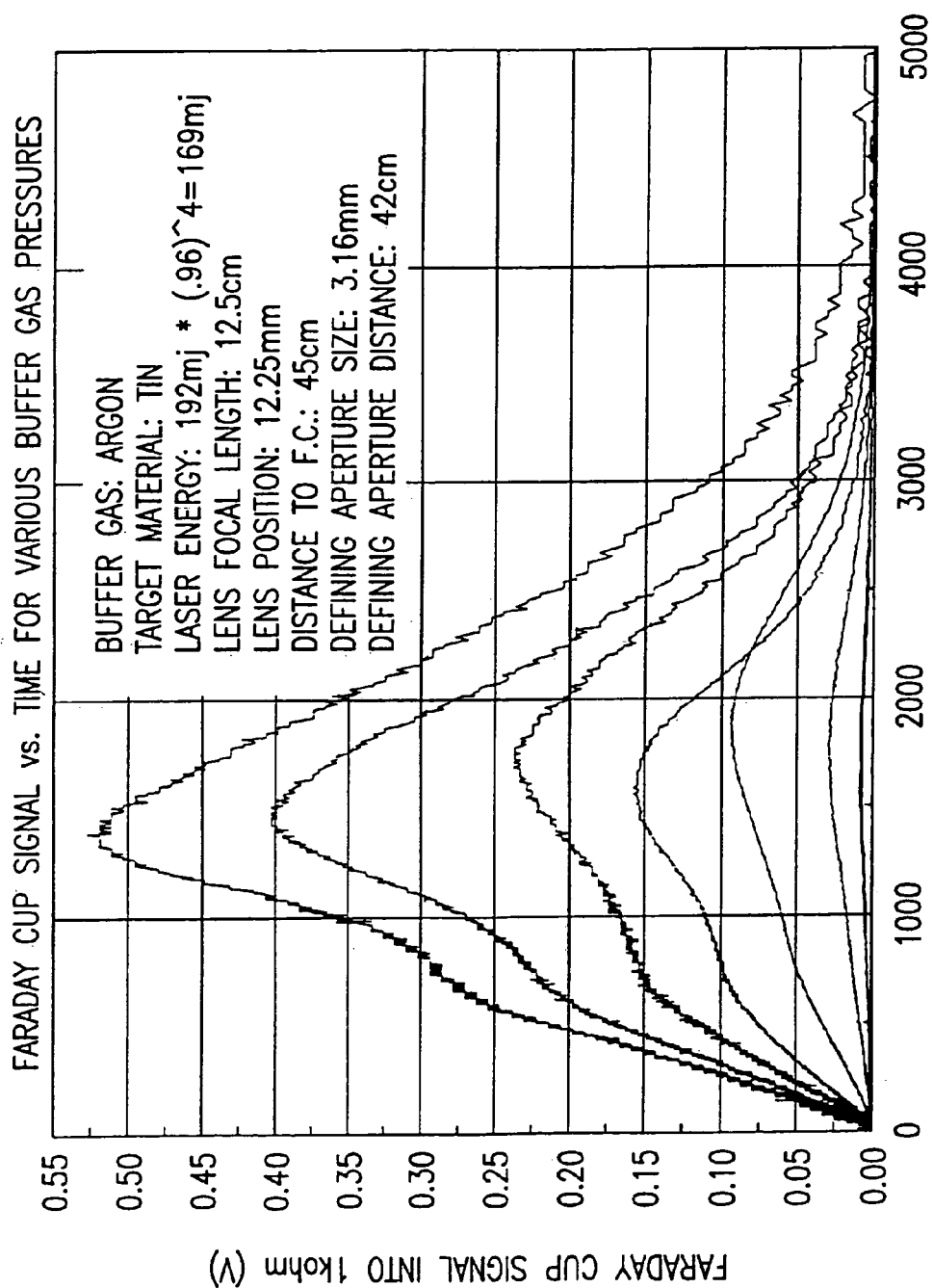

COLLECTOR FOR EUV LIGHT SOURCE

RELATED APPLICATIONS

This application is a divisional of U.S. Ser. No. 10/798,740, filed Mar. 10, 2004 now U.S. Pat. No. 7,217,940, which is a continuation-in-part of U.S. Ser. No. 10/409,254 filed Apr. 8, 2003 now U.S. Pat. No. 6,972,421, the disclosure of which is incorporated by reference herein.

FIELD

The disclosed subject matter relates to the field of the generation of EUV (soft-x-ray) light for such applications as semiconductor integrated circuit lithography exposure light sources, and more particularly to light collectors for such devices.

BACKGROUND

The need for such applications as ever increasingly smaller critical dimensions for semiconductor integrated circuit manufacturing the need has arisen to move from the generation of Deep Ultraviolet ("DUV") light to Extreme Ultraviolet ("EUV") light, also referred to as soft-x-ray light. Various proposals exist for apparatus and methods for the generation of such light at effective energy levels to enable, e.g., adequate throughput in an EUV lithography tool (e.g., a stepper scanner or scanner) over an acceptable lifetime between, e.g., replacements of major components.

Proposals exist for generating, e.g., light centered at a wavelength of 13.5 nm using, e.g., Lithium which is introduced into and/or irradiated to form a plasma which excites the lithium atoms to states from which decay results in large part in EUV light photons having an energy distribution centered about 13.5 nm. The plasma may be formed by an electrical discharge using a dense plasma focus electrode in the vicinity of a source of lithium in solid or liquid form, e.g., as discussed in U.S. Pat. No. 6,586,757, entitled PLASMA FOCUS LIGHT SOURCE WITH ACTIVE BUFFER GAS CONTROL, issued to Melynchuk et al. on Jul. 1, 2003, and the above referenced patent application Ser. No. 10/409,254 filed Apr. 8, 2003, and U.S. Pat. No. 6,566,668, entitled PLASMA FOCUS LIGHT SOURCE WITH TANDEM ELLIPSOIDAL MIRROR UNITS, issued to Rauch et al. on May 20, 2003, and U.S. Pat. No. 6,566,667, entitled PLASMA FOCUS LIGHT SOURCE WITH IMPROVED PULSE POWER SYSTEM, issued to Partlo et al on May 20, 2003, which are assigned to the assignee of the present application and applications and patents and other references referenced therein, the disclosures of all of which are hereby incorporated by reference, and also other representative patents or published applications, e.g., United States Published Application No. 2002-0009176A1, entitled X-RAY EXPOSURE APPARATUS, published on Jan. 24, 2002, with inventors Amemlya et al. the disclosures of which are hereby incorporated by reference. In addition, as noted in, e.g., patents and published applications U.S. Pat. No. 6,285,743, entitled METHOD AND APPARATUS FOR SOFT X-RAY GENERATION, issued to Kondo et al. on Sep. 4, 2001, U.S. Pat. No. 6,493,423, entitled METHOD OF GENERATING EXTREMELY SHORT-WAVE RADIATION . . . , issued to Bisschops on Dec. 10, 2002, United States Published Application 2002-0141536A1 entitled EUV, XUV AND X-RAY WAVELENGTH SOURCES CREATED FROM LASER PLASMA . . . , Published on Oct. 3, 2002, with inventor Richardson, U.S. Pat. No. 6,377,651, entitled LASER PLASMA SOURCE FOR EXTREME ULTRAVIOLET LITHOGRAPHY USING WATER DROPLET TARGET, issued to Richardson et al. on Apr. 23, 2002, U.S. Pat. No. 6,307,913, entitled SHAPED SOURCE OF X-RAY, EXTREME ULTRAVIOLET AND ULTRAVIOLET RADIATION, issued to Foster et al. on Oct. 23, 2001, the disclosures of which are hereby incorporated by reference, the plasma may be induced by irradiating a target, e.g., a droplet of liquid metal, e.g., lithium or a droplet of other material containing a target of, a metal, e.g., lithium within the droplet, in liquid or solid form, with, e.g., a laser focused on the target.

Since the amount of energy in the EUV light desired to be produced within the desired bandwidth, from the creation of such a plasma and resultant generation from the plasma of EUV light, is relatively enormous, e.g., 100 Watts/cm$^2$, its is necessary to ensure that the efficiency of the collection of the EUV light be made as high as possible. It is also required that this efficiency not significantly deteriorate, i.e., be able to sustain such high efficiency, over relatively extended periods of operation, e.g., effectively a year of operation at very high pulse repetition rates (4 KHz and above) for an effective 100% duty cycle. Many challenges exist to being able to meet these goals aspects of which are dealt with in explaining aspects of the disclosed subject matter regarding a collector for an EUV light source.

Some issues that are required to be addressed in a workable design include, e.g., Li diffusion into the layers of a multi layer normal angle of incidence reflecting mirror, e.g., through an outer coating of ruthenium ("Ru"), with the multilayered mirror made, e.g., of alternating layers of Molybdenum ("Mo" or "Moly") and silicon ("Si") and the impact on, e.g., the primary and/or secondary collector lifetime; chemical reactions between, e.g., Li and Si and the impact on, e.g., the primary and/or secondary collector lifetimes; scatter of out of band radiation, e.g., from the laser producing the irradiation for ignition to form the plasma, e.g., 248 nm radiation from an KrF excimer laser required to be kept low to avoid any impact on resist exposure given that Deep UV resist types may be carried over into the EUV range of lithography and such out of band light scattered from the target can result in exposing the resist very efficiently; achieving a 100 W delivery of output light energy to the intermediate focus; having a lifetime of a primary and secondary collector of at least 5 G pulses; achieving the required conversion efficiency with a given source, e.g., a given target, e.g., a target droplet or target within a droplet, or other targets, the preservation of lifetime of the required multi layer mirrors at operational elevated temperatures and out of band radiation at center wavelengths near, e.g., 13.5 nm.

It is well known that that normal incidence of reflection ("NIR") mirrors can be constructed for wavelengths of interest in EUV, e.g., between about 5 and 20 nm, e.g., around 11.3 nm or 13.0-13.5 nm utilizing multi-layer reflection. The properties of such mirrors depend upon the composition, number, order, crystallinity, surface roughness, interdiffusion, period and thickness ratio, amount of annealing and the like for some or all of the layers involved and also, e.g., such things as whether or not diffusion barriers are used and what the material and thickness of the barrier layer is and its impact on the composition of the layers separated by the barrier layer, as discussed, e.g., in Braun, et al., "Multi-component EUV multi-layer mirrors, Proc. SPIE 5037 (2003) (Braun"); Feigl, et al., "Heat resistance of EUV multi-layer mirrors for long-time applications," Microelectronic Engineering 57-58, p. 3-8 (2001) ("Feigl"), U.S. Pat. No. 6,396,900, entitled MULTILAYER FILMS WITH SHARP, STABLE INTERFACES FOR USE IN EUV AND SOFT X-RAY APPLICATION, issued to Barbee, Jr. et al. on May 28, 2002, based upon an application Ser. No. 10/847,744, filed on May 1, 2002 ("Barbee") and U.S. Pat. No. 5,319,695, entitled MULTILAYER FILM REFLECTOR FOR SOFT X-RAYS, issued to Itoh et al. on Jun. 7, 1994, based on an Application Ser. No. 45,763, filed on Apr. 14, 1993, claiming priority to a Japanese application filed on Apr. 21, 1992 ("Itoh").

Itoh discusses materials of different X-ray refractive indexes, for example, silicon (Si) and molybdenum (Mo), alternately deposited on a substrate to form a multilayer film composed of silicon and molybdenum layers and a hydrogenated interface layer formed between each pair of adjacent layers. Barbee discusses a thin layer of a third compound, e.g., boron carbide ($B_4C$), placed on both interfaces (Mo-on-Si and Si-on-Mo interface). This third layer comprises boron carbide and other carbon and boron based compounds characterized as having a low absorption in EUV wavelengths and soft X-ray wavelengths. Thus, a multi-layer film comprising alternating layers of Mb and Si includes a thin interlayer of boron carbide (e.g., $B_4C$) and/or boron based compounds between each layer. The interlayer changes the surface (interface) chemistry, which can result in an increase of the reflectance and increased thermal stability, e.g., for Mo/Si where inter-diffusion may be prevented or reduced, resulting in these desired effects. Barbee also discusses varying the thickness of the third layer from the Mo-on-Si interface to the Si-on-Mo interface. Barbee also discusses the fact that typically the sharpness of the Mo-on-Si interface would be about 2.5 times worse than that of the Si-on-Mo interface; however, due to the deposition of the interlayer of $B_4C$ in the Mo-on-Si interface, such interface sharpness is comparable to that of the Si-on-Mo interface. Braun discusses the use of carbon barrier layers to reduce inter-diffusion at the Mo—Si boundaries to improve the thermal stability and lower internal stress and at the same time increasing reflectivity. Braun notes that normally the Mo—Si boundary forms $MoSi_2$ at the interface in varying thicknesses at the Mo-on-Si boundary and the Si-on-Mo boundary, and also that the morphology of the Mo and/or Si layers can be influenced by barrier layers of, e.g., carbon content. In addition, Braun notes the impact of barrier layer formation on interface roughness of the Mo—Si interface without a barrier layer. Braun reports a reflectance at $\lambda$=13.3 mm of 70.1% using Mo/SiC multi-layers. The reduction in internal stress using $B_4C$ even with annealing as compared to Mo/Si/C multi-layers, which impacts the ability to uses such multi-layer mirrors for curved mirrors is also discussed. Braun also discusses the tradeoff between interlayer contrast, impacting reflectivity, and absorption in the multi-layer configurations, such that, e.g., NbSi layers with lower absorption in the Nb but also lower contrast, and Ru/Si with higher contrast but also higher absorption in the Ru layer, both performing less effectively than a Mo/Si multi-layer stack. Braun also discusses the theoretical utility of using three layers of, e.g., Mo/Si/Ag or Mo/Si/Ru, which have theoretically higher reflectivity, but that the Ag embodiment fails to achieve the theoretical reflectivity due to voids in the Ag layer at desired thicknesses and a calculated best reflectivity of a Mo/Si/C/Ru multi-layer stack at $\lambda$=13.5 nm, with a thickness constrained in the Mo layer to prevent crystallization in the Mo layer. However, Braun also finds that the Mo/Si/C/Ru multi-layer stacks do not live up to theoretical calculated reflectivity expectation, probably due to an initial Mo layer deposition surface roughness that propagates upward through the stack. Feigl discusses the impact of elevated temperatures up to 500° C. on the structural stability of, e.g., Mo/Si and $Mo/Mo_2C/Si/Mo_2C$ multilayer stacks, including the use of ultra thin $Mo_2C$ barrier layers. Feigl notes that the barrier layer prevents the formation of inter-diffusion layers of $MoSi_x$ due to annealing of the Mo and Si at temperatures above, e.g., 200° C. and that $Mo/Mo_2C/Si/Mo_2C$ and $Mo_2C/Si$ systems remain stable up to 600° C. The former system having ultra thin $Mo_2C$ barrier layers ($MoSi_2$ is also suggested but not tested) layers and the latter is formed by substituting $Mo_2C$ for Mo in a multilayer system. The reflectivity of the $Mo_2C/Si$ system remained above 0.8 through 600° C. according to Feigl, whereas the $Mo/Mo_2C/Si/Mo_2C$ system tailed off to slightly less than 0.7 at that temperature, and even decreased to about 0.7 at 400° C.

Applicants in the present application propose certain other materials for barrier layers and other potential improvements to the multi-layer stack for EUV applications.

SUMMARY

It will be understood by those skilled in the art that an apparatus and method is disclosed which may comprise, a multi-layer reflecting coating forming an EUV reflective surface which may comprise an inter-diffusion barrier layer which may comprise a carbide selected from the group ZrC and NbC or a boride selected from the group $ZrB_2$ and $NbB_2$ or a disilicide selected from the group $ZrSi_2$ and $NbSi_2$ or a nitride selected from the group BN, ZrN, NbN, BN, ScN and $Si_3N_4$. The apparatus and method may comprise an EUV light source collector which may comprise a collecting mirror which may comprise a normal angle of incidence multi-layer reflecting coating; an inter-diffusion barrier layer comprising a material selected from the group comprising a carbide selected from the group ZrC and NbC, or a boride selected from the group $ZrB_2$ and $NbB_2$ or a disilicide selected from the group $ZrSi_2$ and $NbSi_2$ a nitride selected from the group BN, ZrN, NbN, BN, ScN and $Si_3N_4$. The multi-layer reflecting coating may comprise a capping layer comprising ruthenium. The multilayer reflecting coating may comprise multiple alternating layers of an absorber and a separator. The absorber may comprise molybdenum and the separator may comprise silicon. The capping layer may comprise molybdenum. The sputter thickness rate for sputtering of the capping layer material by material comprising a plasma production material may be at or below a rate that will result in the capping layer material sustaining such sputtering for greater than a selected lifetime. The multi-layer reflecting coating may comprise a capping layer which may comprise a material other than the absorber material and the separator material selected to have a sputter thickness rate that will sustain sputtering by a material comprising a plasma production material at or below a rate that will result in a single layer of the capping layer material sustaining such sputtering for greater than a selected time and to have more favorable properties when exposed to ambient or operating environments than those of the absorber material or the separator material. The multilayer reflecting coating may comprise multiple alternating layers which may comprise a multi-layer mirror optimized for a selected nominal center wavelength in the EUV range. The apparatus and method may comprise a multi-layer reflecting coating forming an EUV reflective surface which may comprise an inter-diffusion barrier layer comprising yttrium, scandium or strontium. The apparatus and method may comprise an EUV light source collector which may comprise a collecting mirror which may comprise a normal angle of incidence multi-layer reflecting coating; an inter-diffusion barrier layer comprising a material comprising yttrium, scandium or strontium. The multilayer reflecting coating may comprise multiple alternating layers which may comprise $MoSi_2/Si$ or $Mo_2C/Si$, with or without an inter-diffusion barrier layer or inter-diffusion barrier layers. The multilayer reflecting coating may comprise multiple alternating layers which may comprise Mo/X/Si/X where X may comprise an inter-diffusion barrier layer which may comprise C or a carbide selected from the group ZrC and NbC, or a boride selected from the group $ZrB_2$ and $NbB_2$, or a disilicide selected from the group $ZrSi_2$ and $NbSi_2$ or a nitride selected from the group BN, ZrN, NbN, BN, ScN and $Si_3N_4$.

A method and apparatus for debris removal from a reflecting surface of an EUV collector in an EUV light source is disclosed which may comprise the reflecting surface comprises a first material and the debris comprises a second material and/or compounds of the second material, the system and method may comprise a controlled sputtering ion source which may comprise a gas comprising the atoms of the sputtering ion material; and a stimulating mechanism exciting the atoms of the sputtering ion material into an ionized state, the ionized state being selected to have a distribution around a selected energy peak that has a high probability of sputtering the second material and a very low probability of sputtering the first material. The stimulating mechanism may comprise an RF or microwave induction mechanism. The gas is maintained at a pressure that in part determines the selected energy peak and the stimulating mechanism may create an influx of ions of the sputtering ion material that creates a sputter density of atoms of the second material from the reflector surface that equals or exceeds the influx rate of the plasma debris atoms of the second material. A sputtering rate may be selected for a given desired life of the reflecting surface. The reflecting surface may be capped. The collector may comprise an elliptical mirror and a debris shield which may comprise radially extending channels. The first material may be molybdenum, the second lithium and the ion material may be helium. The system may have a heater to evaporate the second material from the reflecting surface. The stimulating mechanism may be connected to the reflecting surface between ignition times. The reflecting surface may have barrier layers. The collector may be a spherical mirror in combination with grazing angle of incidence reflector shells, which may act as a spectral filter by selection of the layer material for multi-layer stacks on the reflector shells. The sputtering can be in combination with heating, the latter removing the lithium and the former removing compounds of lithium, and the sputtering may be by ions produced in the plasma rather than excited gas atoms.

DETAILED DESCRIPTION OF PREFERRED EMBODIMENTS

Figure 1:
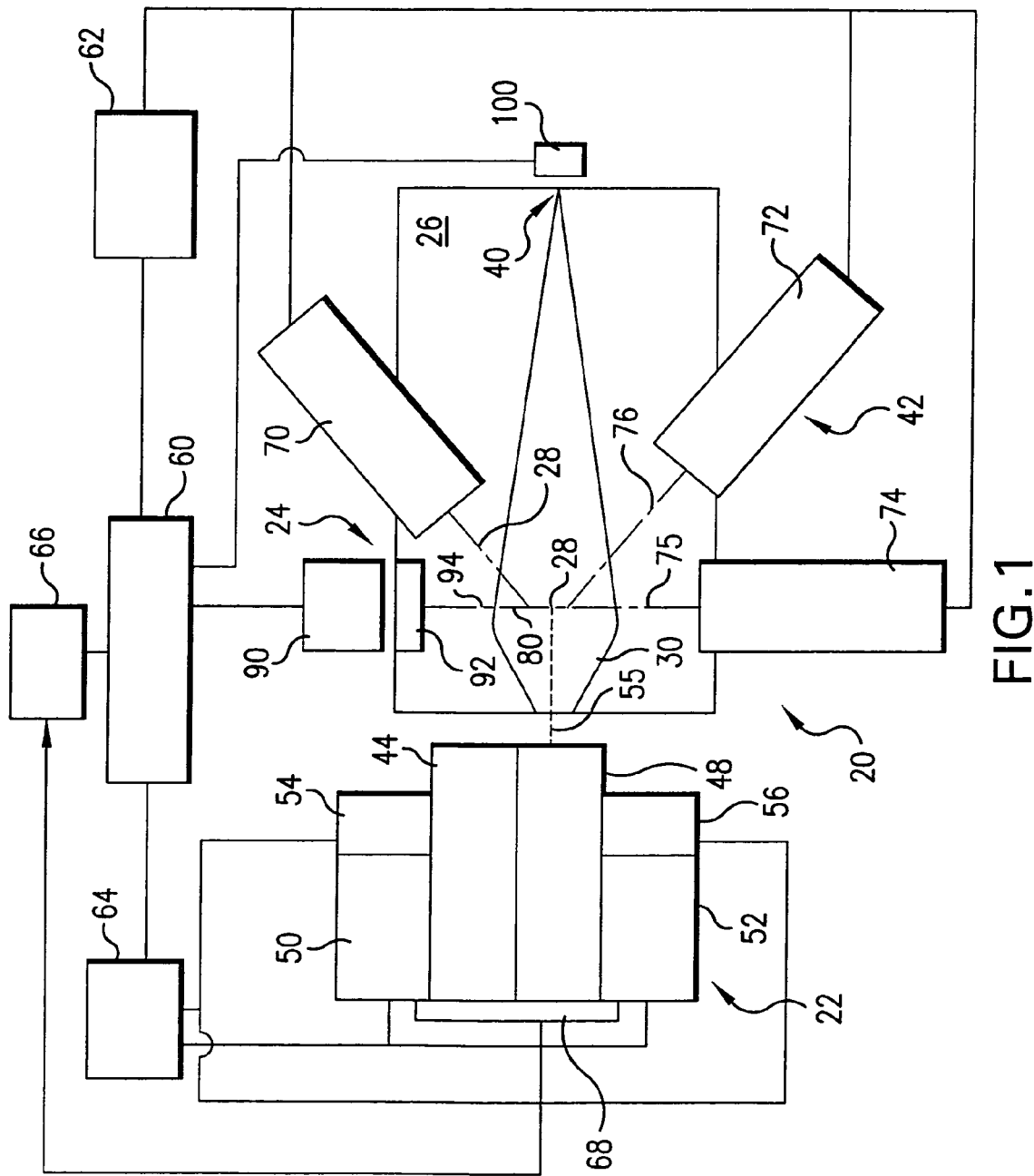
FIG. 1 shows a schematic view of an overall broad conception for a laser-produced plasma EUV light source according to an aspect of the disclosed subject matter.

Turning now to FIG. 1 there is shown a schematic view of an overall broad conception for an EUV light source, e.g., a laser produced plasma EUV light source 20 according to an aspect of the disclosed subject matter. The light source 20 may contain a pulsed laser system 22, e.g., a gas discharge laser, e.g., an excimer gas discharge laser, e.g., a KrF or ArF laser operating at high power and high pulse repetition rate and may be a MOPA configured laser system, e.g., as shown in U.S. Pat. Nos. 6,625,191, 6,549,551, and 6,567,450. The laser may also be, e.g., a solid state laser, e.g., a YAG laser. The light source 20 may also include a target delivery system 24, e.g., delivering targets in the form of liquid droplets, solid particles or solid particles contained within liquid droplets. The targets may be delivered by the target delivery system 24, e.g., into the interior of a chamber 26 to an irradiation site 28, otherwise known as an ignition site or the sight of the fire ball. Embodiments of the target delivery system 24 are described in more detail below.

Laser pulses delivered from the pulsed laser system 22 along a laser optical axis 55 through a window (not shown) in the chamber 26 to the irradiation site, suitably focused, as discussed in more detail below in coordination with the arrival of a target produced by the target delivery system 24 to create an ignition or fire ball that forms an x-ray (or soft x-ray (EUV) releasing plasma, having certain characteristics, including wavelength of the x-ray light produced, type and amount of debris released from the plasma during or after ignition, according to the material of the target.

The light source may also include a collector 30. e.g., a reflector, e.g., in the form of a truncated ellipse, with an aperture for the laser light to enter to the ignition site 28. Embodiments of the collector system are described in more detail below. The collector 30 may be, e.g., an elliptical mirror that has a first focus at the ignition site 28 and a second focus at the so-called intermediate point 40 (also called the intermediate focus 40) where the EUV light is output from the light source and input to, e.g., an integrated circuit lithography tool (not shown). The system 20 may also include a target position detection system 42. The pulsed system 22 may include, e.g., a master oscillator-power amplifier ("MOPA") configured dual chambered gas discharge laser system having, e.g., an oscillator laser system 44 and an amplifier laser system 48, with, e.g., a magnetic reactor-switched pulse compression and timing circuit 50 for the oscillator laser system 44 and a magnetic reactor-switched pulse compression and timing circuit 52 for the amplifier laser system 48, along with a pulse power timing monitoring system 54 for the oscillator laser system 44 and a pulse power timing monitoring system 56 for the amplifier laser system 48. The pulse power system may include power for creating laser output from, e.g., a YAG laser. The system 20 may also include an EUV light source controller system 60, which may also include, e.g., a target position detection feedback system 62 and a firing control system 65, along with, e.g., a laser beam positioning system 66.

The target position detection system may include a plurality of droplet imagers 70, 72 and 74 that provide input relative to the position of a target droplet, e.g., relative to the ignition site and provide these inputs to the target position detection feedback system, which can, e.g., compute a target position and trajectory, from which a target error cam be computed, if not on a droplet by droplet basis then on average, which is then provided as an input to the system controller 60, which can, e.g., provide a laser position and direction correction signal, e.g., to the laser beam positioning system 66 that the laser beam positioning system can use, e.g., to control the position and direction of the laser position and direction changer 68, e.g., to change the focus point of the laser beam to a different ignition point 28.

The imager 72 may, e.g., be aimed along an imaging line 75, e.g., aligned with a desired trajectory path of a target droplet 94 from the target delivery mechanism 92 to the desired ignition site 28 and the imagers 74 and 76 may, e.g., be aimed along intersecting imaging lines 76 and 78 that intersect, e.g., alone the desired trajectory path at some point 80 along the path before the desired ignition site 28.

The target delivery control system 90, in response to a signal from the system controller 60 may, e.g., modify the release point of the target droplets 94 as released by the target delivery mechanism 92 to correct for errors in the target droplets arriving at the desired ignition site 28.

An EUV light source detector 100 at or near the intermediate focus 40 may also provide feedback to the system controller 60 that can be, e.g., indicative of the errors in such things as the timing and focus of the laser pulses to properly intercept the target droplets in the right place and time for effective and efficient LPP EUV light production.

Figure 1A:
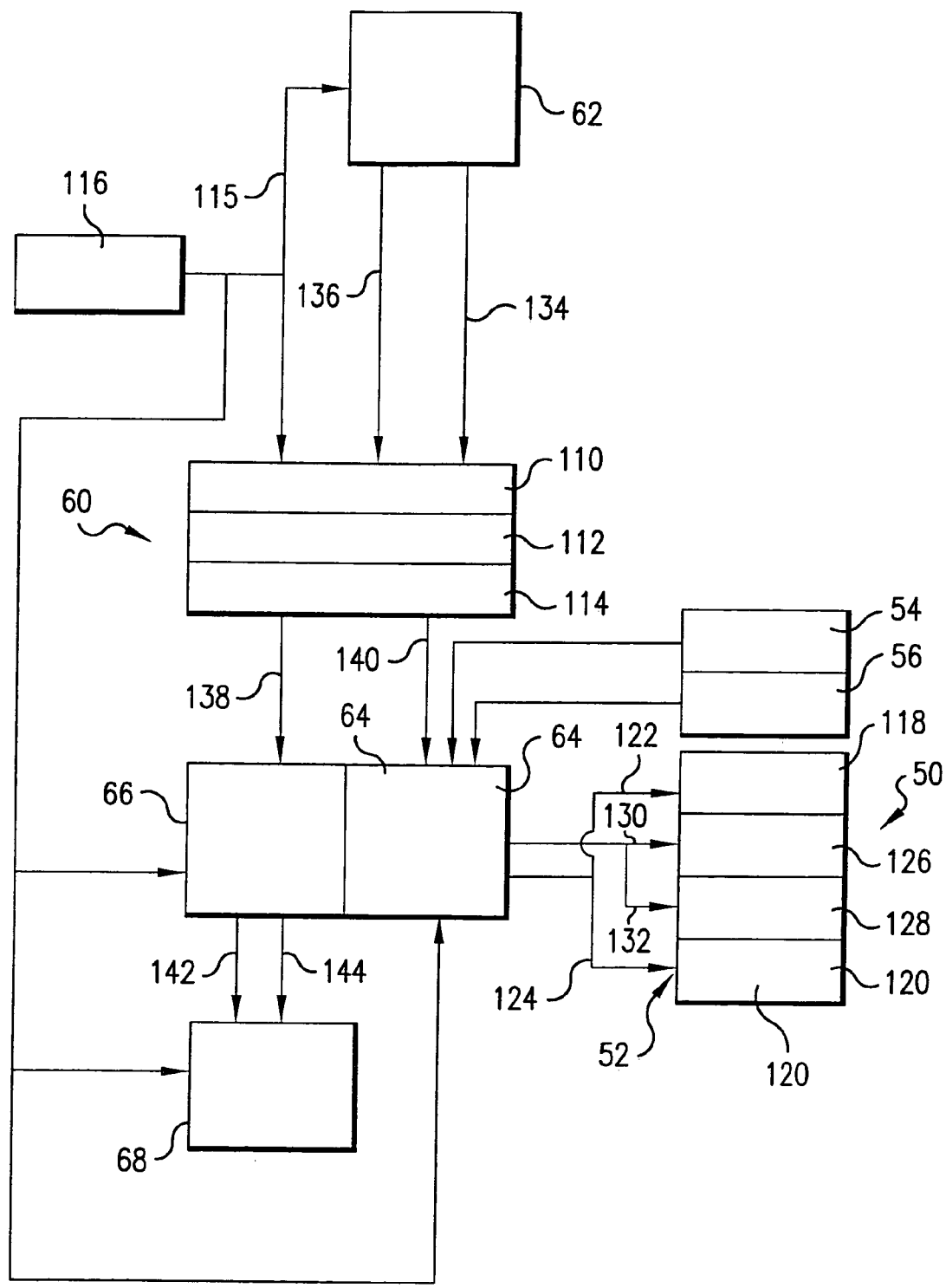
FIG. 1A shows schematically the operation of the system controller according to an aspect of an embodiment of the disclosed subject matter.

Turning now to FIG. 1A there is shown schematically further details of a controller system 60 and the associated monitoring and control systems, 62, 64 and 66 as shown in FIG. 1. The controller may receive, e.g., a plurality of position signal 134, 136 a trajectory signal 136 from the target position detection feedback system, e.g., correlated to a system clock signal provided by a system clock 116 to the system components over a clock bus 115. The controller 60 may have a pre-arrival tracking and timing system 110 which can, e.g., compute the actual position of the target at some point in system time and a target trajectory computation system 112, which can, e.g., compute the actual trajectory of a target drop at some system time, and an irradiation site temporal and spatial error computation system 114, that can, e.g., compute a temporal and a spatial error signal compared to some desired point in space and time for ignition to occur.

The controller 60 may then, e.g., provide the temporal error signal 140 to the firing control system 64 and the spatial error signal 138 to the laser beam positioning system 66. The firing control system may compute and provide to a resonance charger portion 118 of the oscillator laser 44 magnetic reactor-switched pulse compression and timing circuit 50 a resonant charger initiation signal 122 and may provide, e.g., to a resonance charger portion 120 of the PA magnetic reactor-switched pulse compression and timing circuit 52 a resonant charger initiation signal, which may both be the same signal, and may provide to a compression circuit portion 126 of the oscillator laser 44 magnetic reactor-switched pulse compression and timing circuit 50 a trigger signal 130 and to a compression circuit portion 128 of the amplifier laser system 48 magnetic reactor-switched pulse compression and timing circuit 52 a trigger signal 132, which may not be the same signal and may be computed in part from the temporal error signal 140 and from inputs from the light out detection apparatus 54 and 56, respectively for the oscillator laser system and the amplifier laser system.

The spatial error signal may be provided to the laser beam position and direction control system 66, which may provide, e.g., a firing point signal and a line of sight signal to the laser bean positioner which may, e.g. position the laser to change the focus point for the ignition site 28 by changing either or both of the position of the output of the laser system amplifier laser 48 at time of fire and the aiming direction of the laser output beam.

Figure 2A:
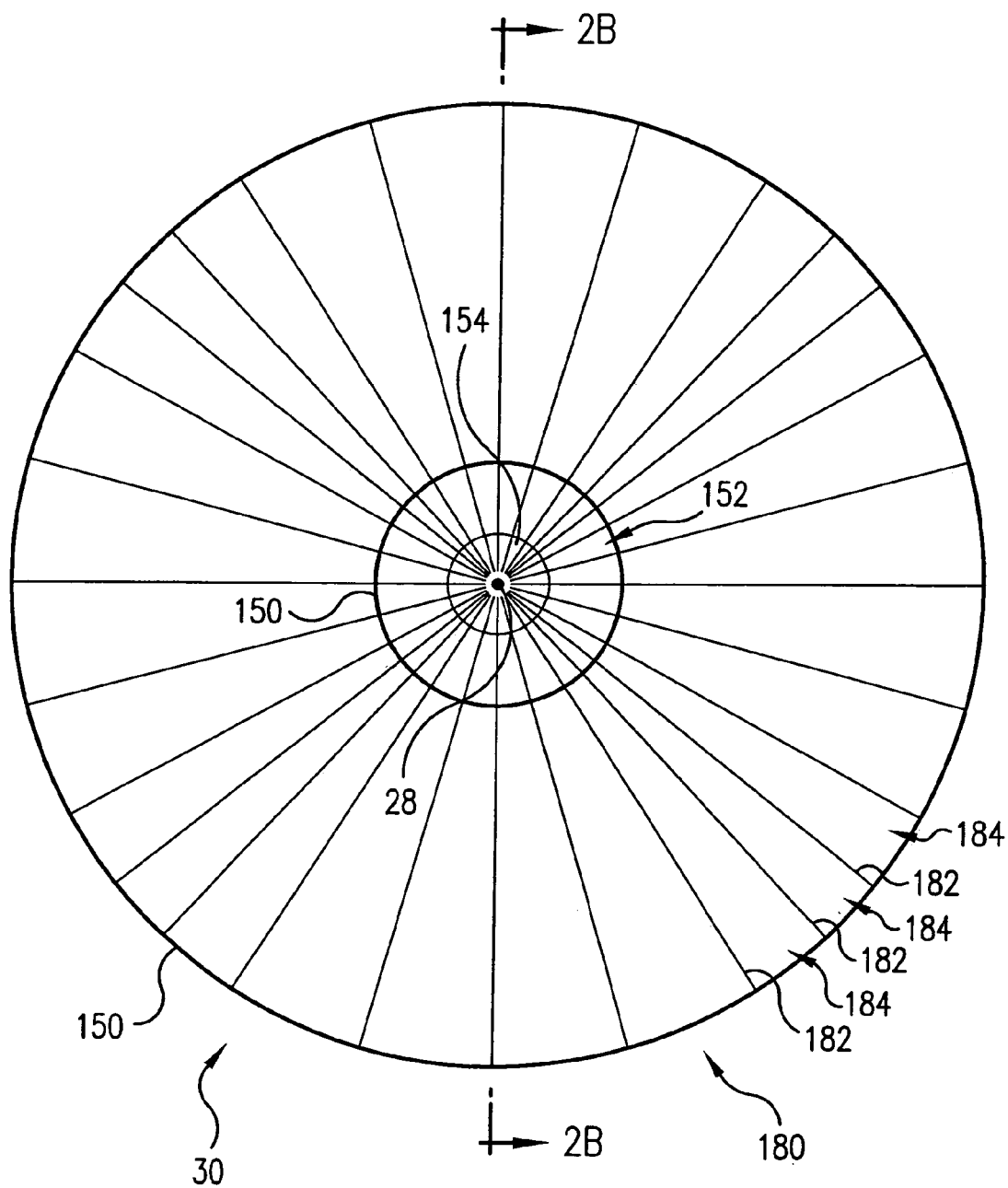
FIG. 2A shows a side view of an embodiment of an EUV light collector according to an aspect of the disclosed subject matter looking from an irradiation ignition point toward an embodiment of a collector according to an embodiment of the disclosed subject matter.
Figure 2B:
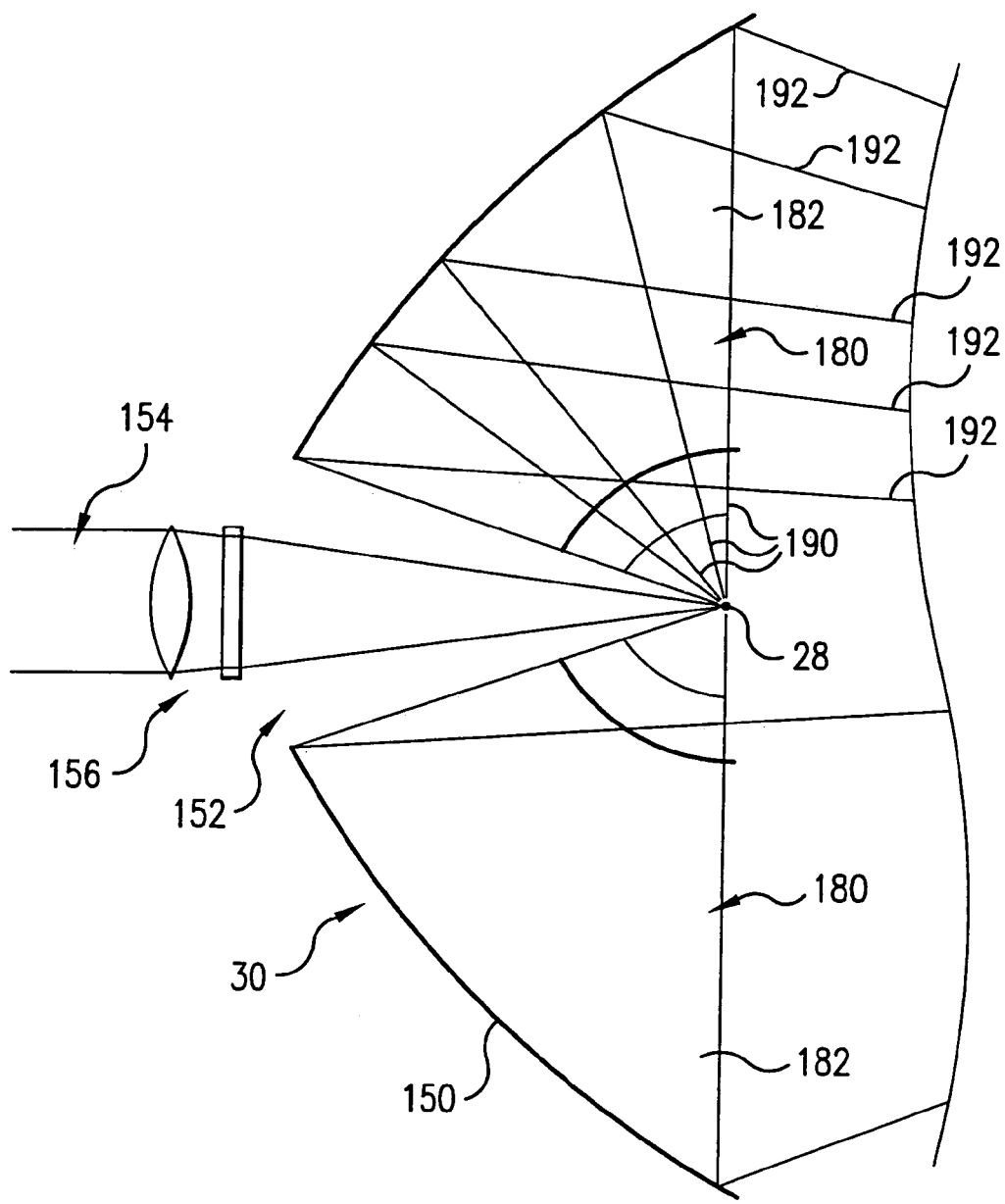
FIG. 2B shows a cross-sectional view of the embodiment of FIG. 2A along the lines 2B in FIG. 2A.

Turning now to FIGS. 2A and 2B there is shown, respectively a schematic view side view of a collector 30 looking into the collector mirror 150, and a cross-sectional view of the rotationally symmetric collector mirror 150 arrangement along cross-sectional lines 2B in FIG. 2A (although the cross-sectional view would be the same along any radial axis in FIG. 2A.

As shown in FIG. 2A the elliptical collection mirror 150 is circular in cross section looking at the mirror, which may be the cross-section at the greatest extension of the mirror, which is shown in FIG. 1A to be almost to the focus point 28 of the elliptical mirror 150, so as not to block target droplets 94 from reaching the ignition point designed to be at the focus point 28. It will be understood, however, that the mirror may extend further towards the intermediate focus, with a suitable hole in the mirror (not shown) to allow passage of the target droplets to the focus point. The elliptical mirror may also have an aperture 152, e.g., shown to be circular in FIG. 2A, to allow entry of the LPP laser beam 154, e.g., focused through focusing optics 156, through the mirror 150 to the ignition point 28 desired to be at the focus of the elliptical mirror. The aperture 152 can also be, e.g., more tailored to the beam profile, e.g., generally rectangular, within the requirements, if any of modifying the beam optical path to make corrections of the focus of the laser beam 154 on an ignition site, depending upon the type of control system employed.

Also shown in FIGS. 2A and 2B is a debris shield 180 according to an aspect of an embodiment of the disclosed subject matter. The debris shield 180 may be made up of a plurality of thin plates 182, made, e.g., of thin foils of molybdenum, extending radially outward from the desired ignition site and defining narrow planar radially extending channels 184 through the debris shield 180. The illustration of FIG. 2A is very schematic and not to scale and in reality the channels are as thin as can possibly be made. Preferably the foil plates 182 can be made to be even thinner than the channels 184, to block as little of the x-ray light emitted from the plasma formed by ignition of a target droplet 94 by the laser beam 155 focused on the ignition site 28.

Seen in cross section in FIG. 2B, the functioning of the channels 182 in the debris shield 180 can be seen. A single radial channel is seen in FIG. 2B and the same would be seen in any section of the collector 30 through the rotationally symmetric axis of rotation of the collector mirror 150 and debris shield 180 within a channel of the debris shield 180. Each ray 190 of EUV light (and other light energy) emitted from the ignition site 28 traveling radially outward from the ignition site 28 will pass through a respective channel 182 in the debris shield 180, which as shown in FIG. 2B may, if desired, extend all the way to the collection mirror 150 reflective surface. Upon striking the surface of the elliptical mirror 150, at any angle of incidence, the ray 190 will be reflected back within the same channel 180 as a reflected ray 192 focused on the intermediate focus 40 shown in FIG. 1.

Figure 3:
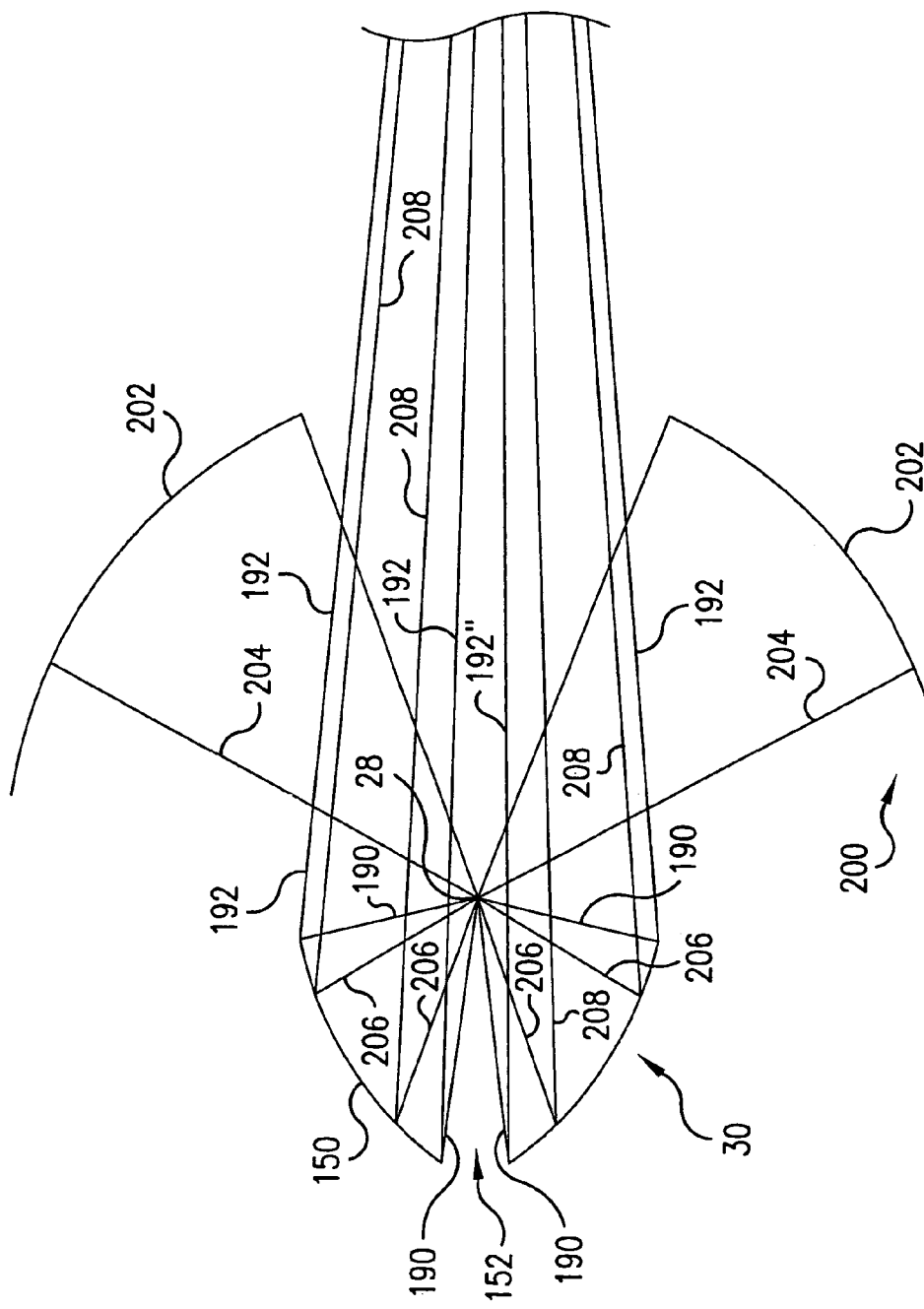
FIG. 3 shows an alternative embodiment of a normal angle of incidence collector according to an aspect of the disclosed subject matter.

Turning now to FIG. 3 there is shown an alternative embodiment according to an aspect of an embodiment of the disclosed subject matter. In this embodiment, the debris shield 180 is not shown for simplicity and this embodiment can be utilized with or without a debris shield as appropriate, as discussed in more detail below, as can also, e.g., the single elliptical collector mirror shown in FIGS. 2A and B. In this embodiment a secondary collector reflecting mirror 200 has been added, which may comprise, e.g., a section of a spherical mirror 202, having a center at the ignition site 28, i.e., the focus of the elliptical mirror 150, and with an aperture 210 for the passage of the light from the collector mirror 150 to the intermediate focus 40 (shown in FIG. 1). The collector mirror 150 functions as discussed above in regard to FIGS. 2A and 2B with respect to rays 190 emitted from the ignition point 28 toward the collector mirror 150. Rays of light 204 emitted from the ignition site 28 away from the collector mirror 150 which strike the section of the spherical mirror 202, will be reflected back through the focus of the elliptical collector mirror 132 and, pass on to the elliptical collector mirror 150 as if emitted from the focus 28 of the elliptical mirror 150, and, therefore also be focused to the intermediate focus 40. It will be apparent that this will occur with or without the presence of the debris shield 180 as described in relation to FIGS. 2A and 2B.

Figure 4:
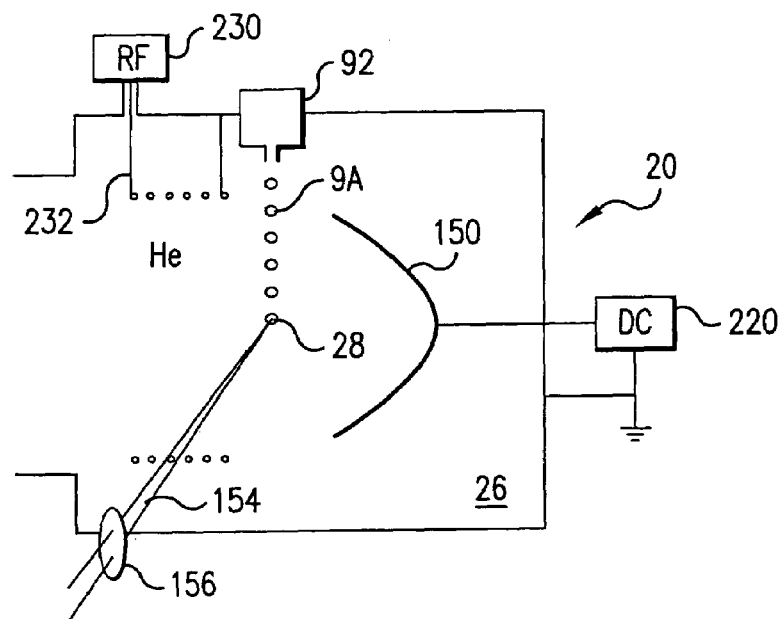
FIG. 4 shows a schematic view of a normal angle of incidence collector debris management system according to an aspect of the disclosed subject matter.

Turning now to FIG. 4 there is shown schematically another aspect of debris management according to an embodiment of the disclosed subject matter. FIG. 4 shows a collector mirror 150 connected to a source of current, e.g., DC voltage source 220. This current can be, e.g., one embodiment of the disclosed subject matter in which the current maintains the reflector at a selected temperature to, e.g., evaporate deposited lithium. An alternate concept for lithium removal from the first collector mirror is to employ helium ion or hydrogen ion sputtering. The low mass of these ions, when kept at low energies (<50 eV), e.g., can lead to extremely low sputter yield for, e.g., the molybdenum layer and/or the silicon layer, e.g., in an EUV multi-layer mirror fabricated with Mo/Si layers.

Turning now to FIG. 4 there is shown a debris cleaning arrangement according to an aspect of an embodiment of the disclosed subject matter. As shown in FIG. 4, a source of current, e.g., DC voltage source 220 may, e.g., be connected to the collector mirror 150, e.g., to a metal, e.g., aluminum or nickel backing (not shown) for the mirror 150. The mirror 150 may thus be heated to an elevated temperature above that of the surrounding gas, e.g., helium gas, making up the content of the EUV light source chamber 26 interior. Other heating of the reflector may occur according to alternative embodiments of the disclosed subject matter, e.g., by radiant heating from, e.g., a heat lamp (not shown) in the vessel 26.

Another aspect of debris cleaning may incorporate, e.g., as shown in FIG. 4, e.g., the introduction of RF, e.g., from a source of RF frequency voltage 230 and an antenna, shown schematically at 232 within the chamber 26 in FIG. 4. In fact, the RF, as with the DC shown in FIG. 4, may be connected to the mirror 150 or a metallic backing (not shown) in which event a dark shield (not shown) made of a suitable conductive material and connected to ground potential may be formed over the back of the collector mirror 150, separated from the mirror 150 by an insulator, e.g., an air gap, and the potential, e.g., DC from DC source 220 that is connected also to the mirror 150.

Figure 5:
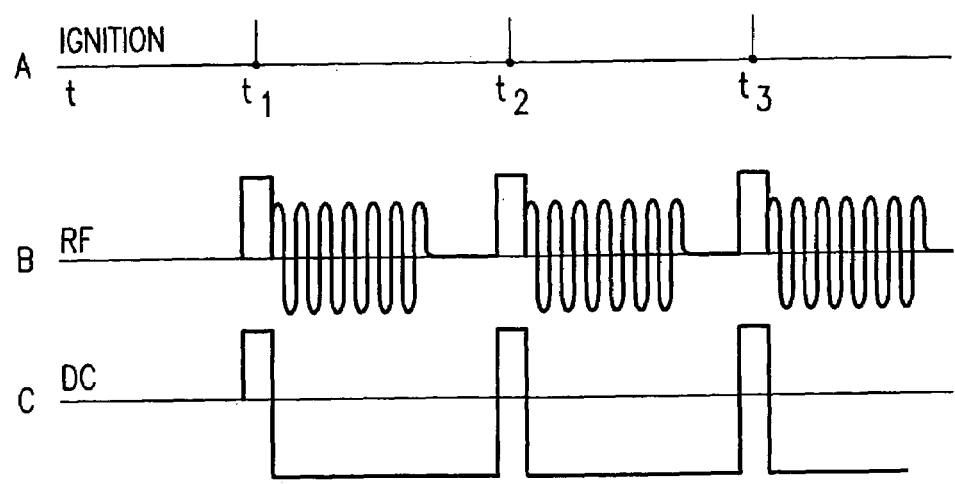
FIGS. 5a-c show a timing of the provision of a collector cleaning signal/current at RF and/or DC to the collector mirror according to an aspect of an embodiment of the disclosed subject matter.

As shown in FIGS. 5a-c, for a given periodic LPP ignition at times $t_1$, $t_2$, $t_3$, the RF may be replaced by a DC voltage during the time when the ignitions occur at $t_1$, $t_2$, $t_3$, and for a short time on either side of the ignition time, with RF between such times, at least directly after the ignition, if not completely through the next occurrence of the DC potential during the next ignition. Also shown is that the DC from source 220 may be a positive potential during the time of the respective ignition, perhaps coextensive with the continuous voltage from the RF source 230, and a negative potential between such positive pulses.

The voltage applied to the collector mirror 150 is meant to, on the one hand, evaporate metallic debris, e.g., lithium emitted from the plasma during and after ignition of a target droplet of such lithium or other target metallic material. Also evaporated could be metallic elements such as K, Fe, Na or the like that appear due, e.g., to impurities in the lithium target droplets themselves and are similarly deposited on the collector mirror 150 surface after ignition.

The RF is meant to form a localized ionic plasma, e.g., of excited He atoms in the vicinity of the collector mirror 150 surface, with the intent that these excited ions in the localized plasma may strike lithium atoms or compounds of lithium on the collector mirror 150 and sputter them off of the mirror surface. This embodiment of the disclosed subject matter contemplates, e.g., a balancing between the evaporation mechanism and the sputtering mechanism, e.g., if the RF is at <500 W power (at 13.65 MHz, as dictated by federal regulations for RF frequency sputtering) then the mirror temperature should be maintained at or near some desired temperature and if the RF is increased, e.g., to >500 W at 13.65 MHz then the temperature can correspondingly be reduced.

Figure 6A:
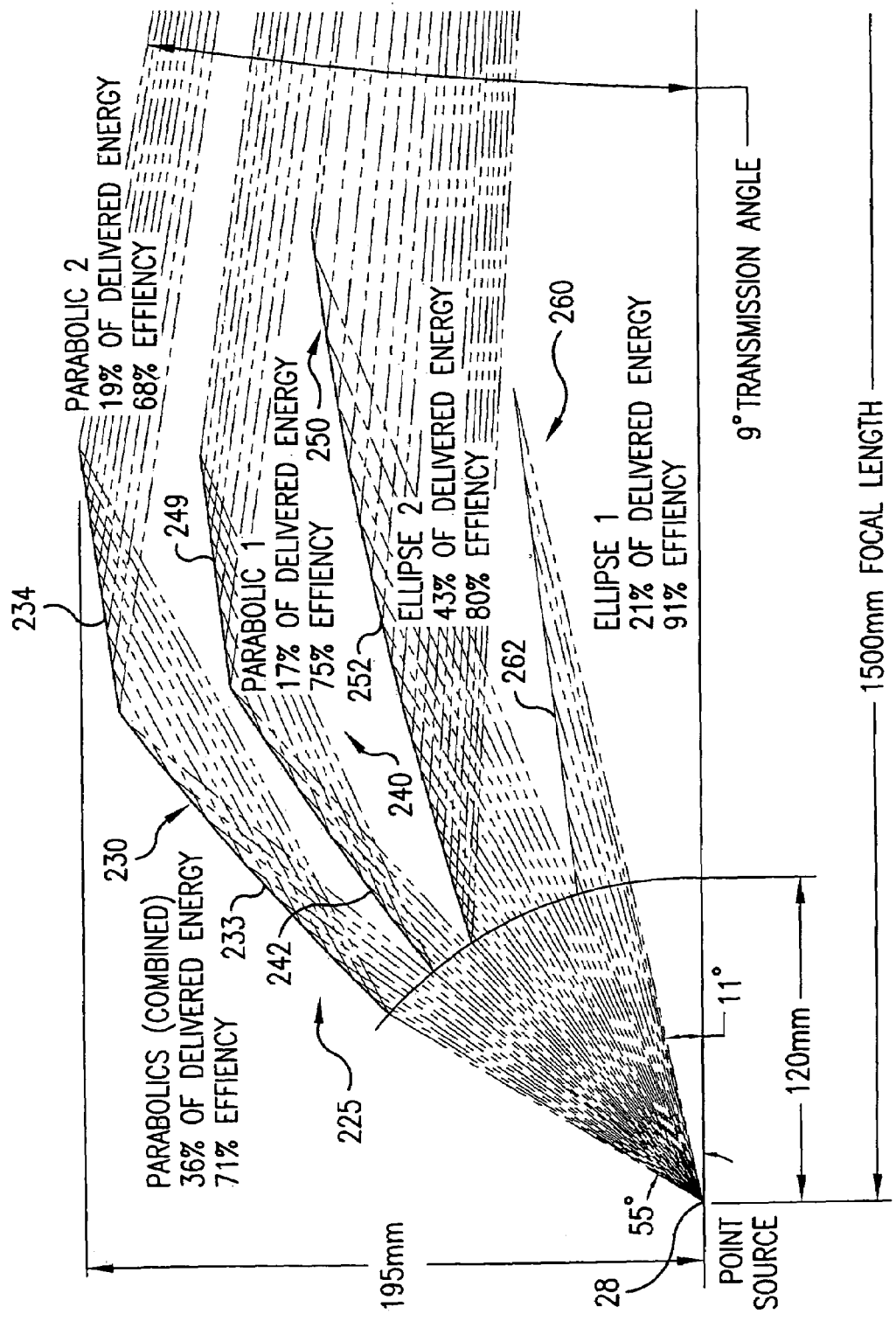
FIGS. 6a and b show schematic views in cross section of aspects of embodiments of the disclosed subject matter relating to grazing angle of incidence collectors.

Turning now to FIGS. 6A and B there are shown aspects of embodiments of the disclosed subject matter relating to alternative collector arrangements. As shown in FIGS. 6A and B a collector 225 may be composed of, e.g., a plurality of nested shells, forming, e.g., different sections made up, e.g., of elliptical and parabolic reflecting shells, e.g., in FIG. 6a parabolic shells 230 and 240 and elliptical shells 250 and 260. The elliptical shells, e.g., 230 and 240 may be comprised of respectively first parabolic reflecting surfaces 233, 242, and second parabolic reflecting surfaces 234, 244. The elliptical sections 250 and 260 may be comprised of, e.g., elliptical reflecting surfaces 252 and 262. In FIG. 6B there is shown an alternative embodiment with an additional two parabolic shell sections 232 and 236, with section 232 comprising, e.g., a first parabolic reflecting surface 231 and a second parabolic reflecting surface 234, and section 236 comprising, e.g., a first parabolic reflecting surface 237, a second parabolic reflecting surface 238 and a third parabolic reflecting surface 239.

Each of the reflecting shells 230, 240, 250 and 260 are arranged to reflect between them 100 percent of the light emitted from the ignition point 21 within a section of a sphere from 11° to 55° from an axis of rotation 310 generally aligned with the focus of the collector 225 reflecting shells, with the shells 230, 240, 250 and 260 being generally symmetric about this axis of rotation 310 also. By way of example, the embodiment of FIG. 6A shows an embodiment where essentially all of the light in the portion of the sphere just described enters at least one of the shells 230, 240, 250 and 260. In the case of parabolic shell sections 230 and 240 is incident on the first reflecting surfaces 233, 242, and either reflected towards the intermediate focus 40, or is the also reflected off of the respective second reflective surface 234, 244 to the intermediate focus. In the case of the elliptical shell sections 250, 260 all of the light entering each such shell 250, 260 is reflected to the intermediate focus, e.g., because the ellipses formed by the reflecting surfaces 252, 262 each have a first focus at the ignition point 28 and a second focus at the intermediate focus 40.

Figure 19:
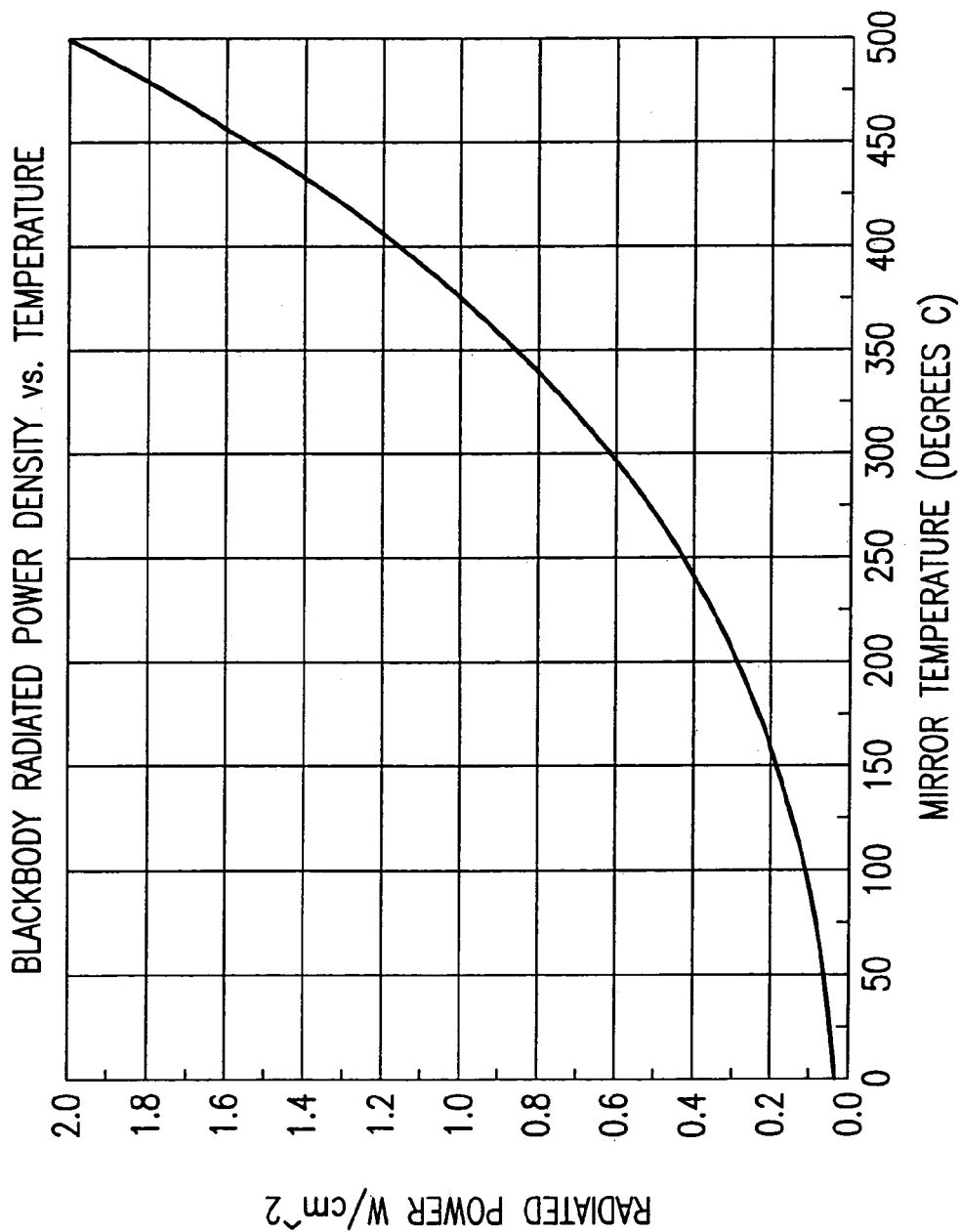
FIG. 19 shows a radiated power density vs. temperature for a black body useful in illustrating an aspect of an embodiment of the disclosed subject matter.

Depending on the material of the respective reflecting surfaces 233, 234, 242, 244, 252 and 262, the angle of incidence of the particular rays, the number of reflections in a given shell section 230, 240, 250 and 260, a certain average efficiency of reflection will occur and also depending on the construction of the shells a certain percentage of the available light will enter each section 230, 240, 250 and 260, such that, as illustrated in FIG. 6A 19% is reflected and focused in shell section 230 at an average total efficiency of 65%, 17% is reflected and focused in shell section 240 at an average total efficiency of 75%, 43% is reflected in shell section 250 at an average total efficiency of 80% and 21% is reflected and focused in shell section 260 with an average total efficiency of 91%.

FIG. 6B shows an alternative embodiment adding two more parabolic shell sections 232, 236. These added sections may serve, e.g., to collect more light up to about 85% from the axis of rotation and at least one of the added sections may have a first reflective surface 237, a second reflective surface 238 and a third reflective surface 239. As can be seen from FIG. 6B, e.g., a ray 290 of emitted light from the source or ignition point may just enter the parabolic reflective shell section 236 and be reflected as ray 292 to the second reflective surface 238 and then reflected as ray 294 to the third reflective surface 239 and then form focused ray 296. Similarly a ray 300 may just enter the parabolic reflector shell 236 at the other extremity of the shall opening and also be reflected off of the first reflective surface 237 as ray 320 and the second reflective surface 237 as ray 304 and the very end of the third reflective surface as focused ray 306. In the case of, e.g., one of the parabolic shell sections, e.g., section 240 a ray 280 may just enter this section 240 and be reflected off of the first parabolic reflecting surface 242 as ray 282 and the very end of the second parabolic reflecting surface as focused ray 283, and another ray 284 may just enter the section 240 to be reflected off of the second reflective surface 244 as focused ray 286. In the case of one of the elliptical shell sections, e.g., 250, a ray 308 emitted from the ignition point may just enter the shell section 250 and be reflected off of the elliptical reflecting surface 252 as a focused ray 309, and a ray 318 just enter the shell section 250 at the opposite side as ray 308 and be reflected as focused ray 319.

Figure 7:
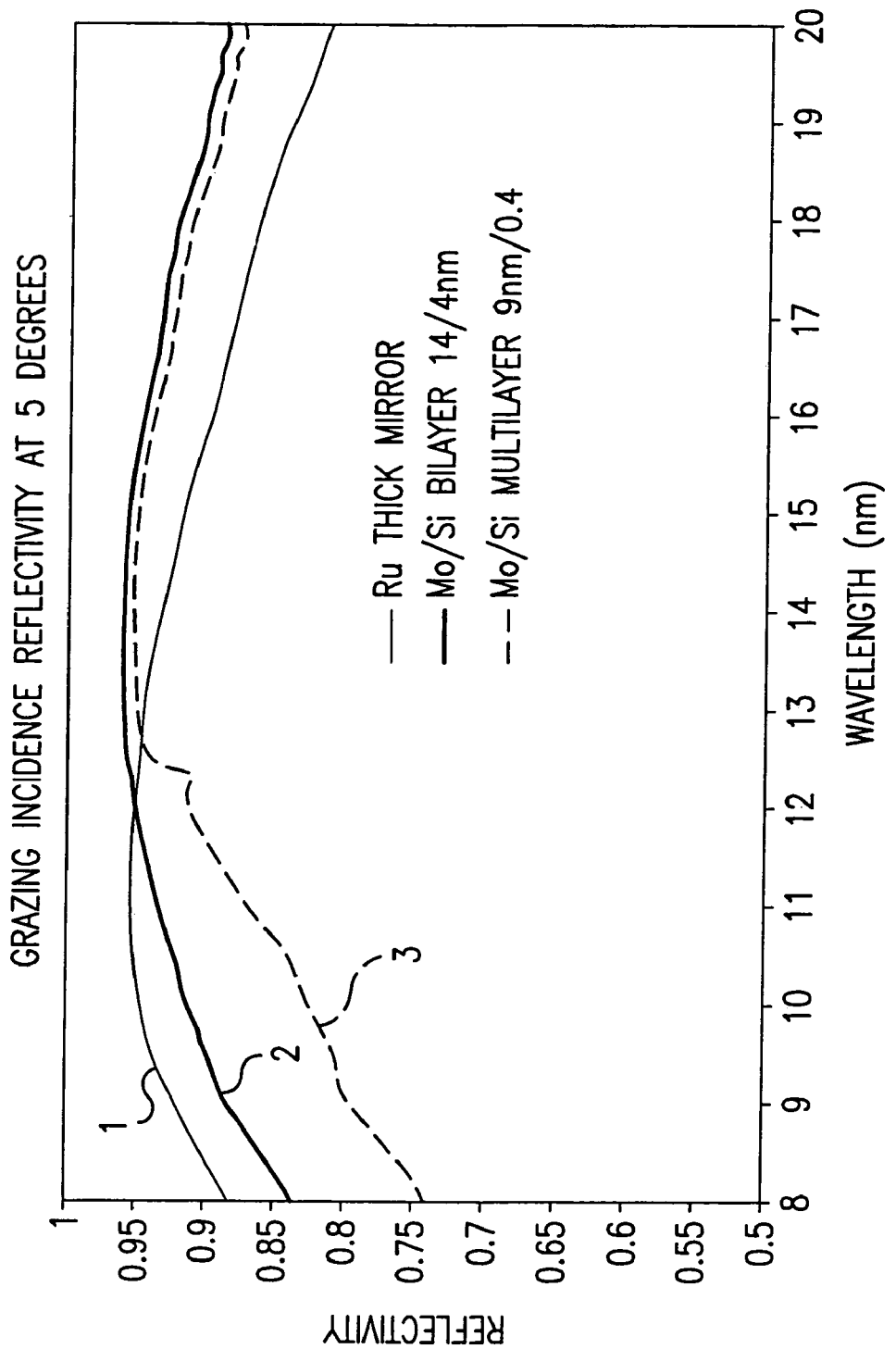
FIG. 7 shows a plot of grazing angle of incidence reflectivity for a variety of reflective surfaces at given wavelengths of relevance at an angle of incidence of 5 degrees.
Figure 8:
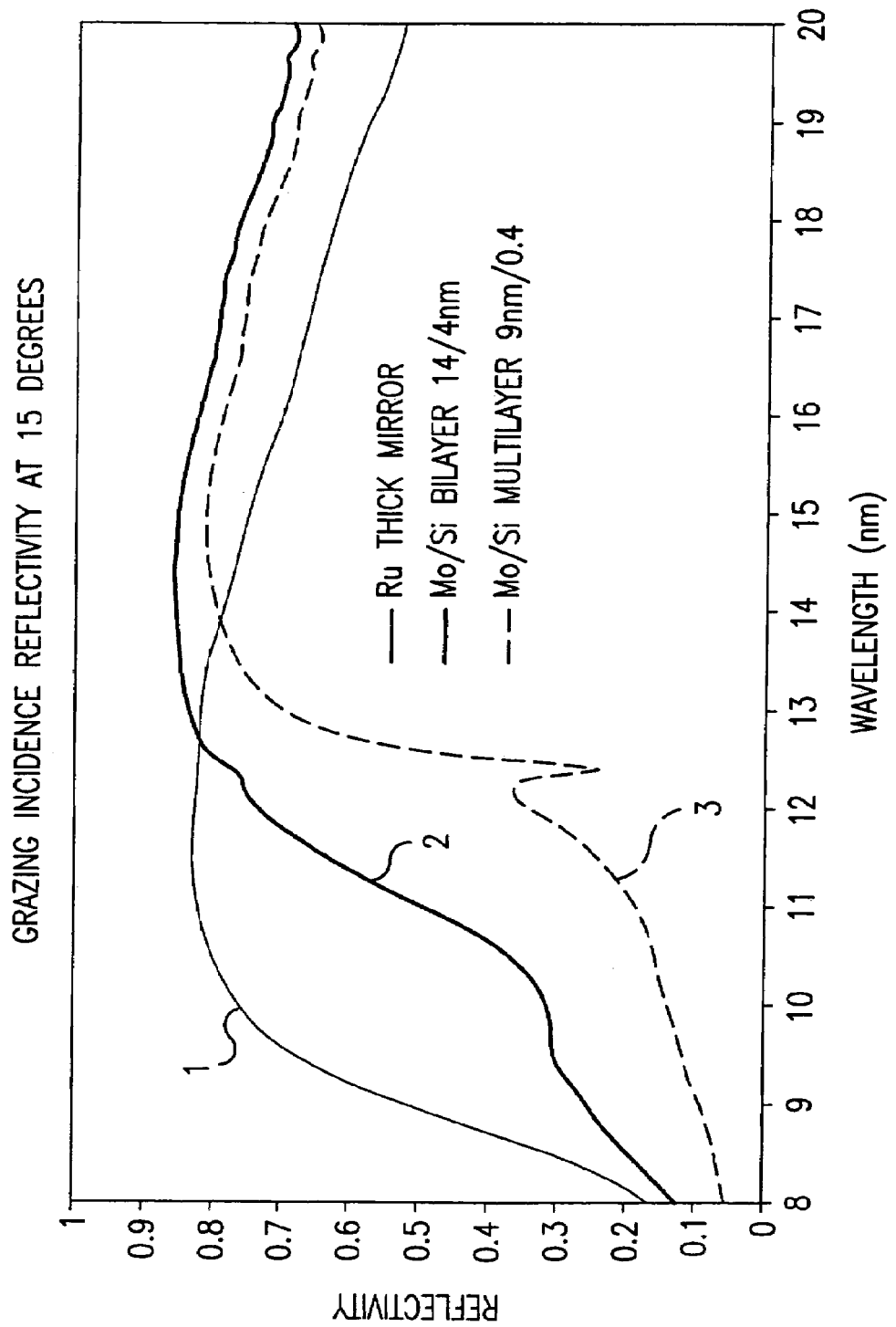
FIG. 8 shows a plot of grazing angles of incidence reflectivity for a variety of reflective surfaces at given wavelengths of relevance for 15 degrees.

Turning now to FIGS. 7 and 8 there is shown a plot of grazing angle of incidence reflectivity for (1) a single layer Ruthenium reflecting surface and (2) a Mo/Si bilayer stack with a Mo/Si 14 nm thick single Mo layer and a 4 nm single Si layer and (3) a ten period multi-layer Mo/Si stack, with a pitch of 9.4 nm and a MO/Si thickness ratio of 22.5:1, having, e.g., 40 multi-layer stacks, each for grazing angles of incidence of 5° and 15°. In each of the reflectors with Mo/Si a molybdenum substrate is assumed. In the case where spectral purity is a part of the specification for the delivered light, collectors can be tuned to a certain wavelength, with some given bandwidth spread, e.g., by using the reflective properties of, e.g., a nested shell collector to favor reflectivity near a selected center wavelength, e.g., in the embodiments of FIGS. 6A and B.

Figure 9:
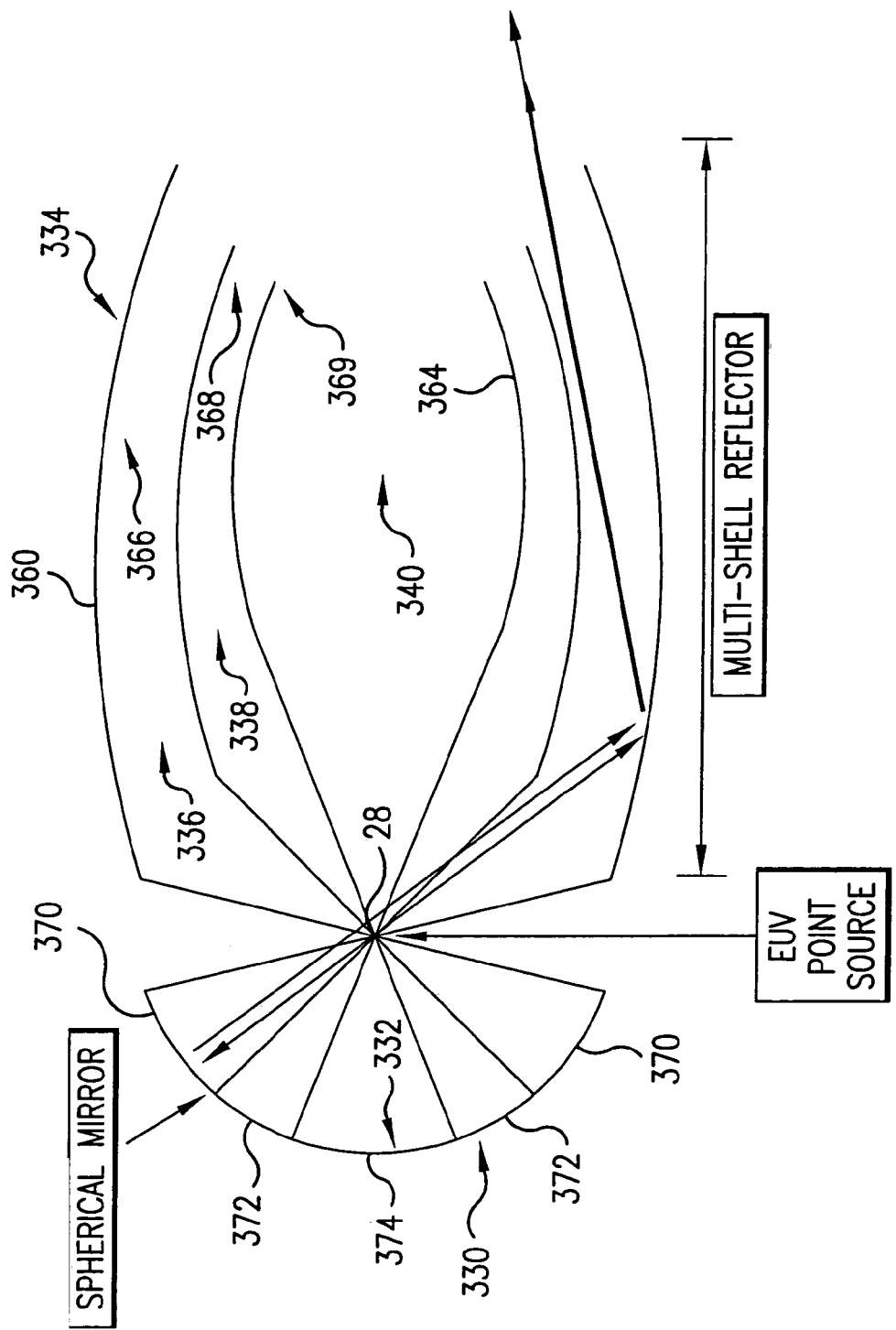
FIG. 9 shows a schematic view of an alternative embodiment of a collector according to an aspect of the disclosed subject matter.

FIG. 9 shows aspects of an embodiment of the disclosed subject matter. In this embodiment a collector assembly 330 may comprise, e.g., a portion of a spherical mirror reflecting surface 332, which may be a normal angle of incidence multi-layer stack, reflecting the light produced from the ignition point 28 to one of, e.g., three nested elliptical shell sections 336, 338 and 340 in a nested elliptical shell collector 334. Each of the shell sections 336, 338 and 340 may have a reflecting surface 366, 368, 369 that is on the inside of a respective shell 360, 362, 364. As shown in FIG. 9, e.g., the shell section 336 may receive the light from a rim section 370 of the spherical mirror 332, the shell section 338 may receive the light from an intermediate section of the spherical mirror 332 and the shell section 340 receives the light reflected from a central portion of the spherical mirror 332.

The shell sections 336,338 and 340 may be coated with a multi-layer of Mo/Si rather than the conventionally proposed thick single layer of Ru. According to aspects of an embodiment of the disclosed subject matter two reflections occur, e.g., one from the spherical mirror and one in each shell, e.g., for shells having elliptical reflecting surfaces, at grazing angles between about 5° and 15°, as can be seen from FIGS. 7 and 8. This can, e.g., significantly reduce, e.g., a significant amount of out of band EUV radiation, e.g., assuming that 13.5 is the desired band. Ru mirrors, e.g., in a Wolter-type configuration remain very reflective for both 13.5 nm and 11 nm at both 5° and 15° grazing angles of incidence, whereas Mo/Si stacks of grazing angle of incidence reflective coatings, as shown in FIGS. 7 and 8 can be much more selective, especially around 15°.

The above described embodiment does not have the spatial purity of, e.g., a grating spectral purity filter, as has been proposed in the art, but it does have a significant advantage in reflectivity and preservation of in-band EUV radiation over the other solutions, e.g., a grating filter, proposed in the art.

A lithium LPP EUV light source according to aspects of embodiments of the disclosed subject matter, could employ a solid stream of liquid lithium or a lithium droplet source. For a droplet source, the number of atoms per droplet can be calculated and for a solid stream one can assume that only material within the focused beam constitutes a droplet at ignition, although, from a debris standpoint adjacent material in the stream may also form debris, particularly if struck by lower energy laser radiation in the skirts of the energy distribution of the focused laser beam.

Since it is contemplated that it is desirable for the droplet source to have a droplet size matched to the focused beam, both types of target source can be considered to have the same droplet size given by a droplet diameter, $d_{droplet}$. The volume of the droplet is then given by:

$$V_{droplet} = \frac{1}{6}\pi d_{droplet}^3. \quad \{1\}$$

Calculating the number of atoms per droplet follows from the density of, e.g., lithium and its atomic weight. The mass of the droplet is:

$$M_{droplet} = V_{droplet}\rho_{lithium} \quad \{2\};$$

where $\rho_{lithium} = 0.535$ g/cm³ is the density of lithium, such that:

$$M_{droplet} = 0.280 \cdot d_{droplet}^3 \quad \{3\};$$

where the droplet diameter is in centimeters and the resulting mass is in grams. The number of atoms in the droplet is then given by dividing the droplet mass by the atomic mass of lithium and converting units properly:

$$N_{atoms} = \frac{M_{droplet}(g)}{M_{lithium\ atom}(amu)} \cdot \frac{1\ amu}{1.6605 \times 10^{-24}\ g}; \quad \{4\}$$

where $M_{lithium\ atom} = 6.941$ amu, i.e., $$N_{atoms} = 2.43 \times 10^{22} \cdot d_{droplet}^3 \quad \{5\};$$

where the diameter of the droplet is in centimeters. Converting the droplet diameter from centimeters to micrometers gives:

$$N_{atoms} = 2.43 \times 10^{10} \cdot d_{droplet}^3 \quad \{6\}.$$

Figure 10:
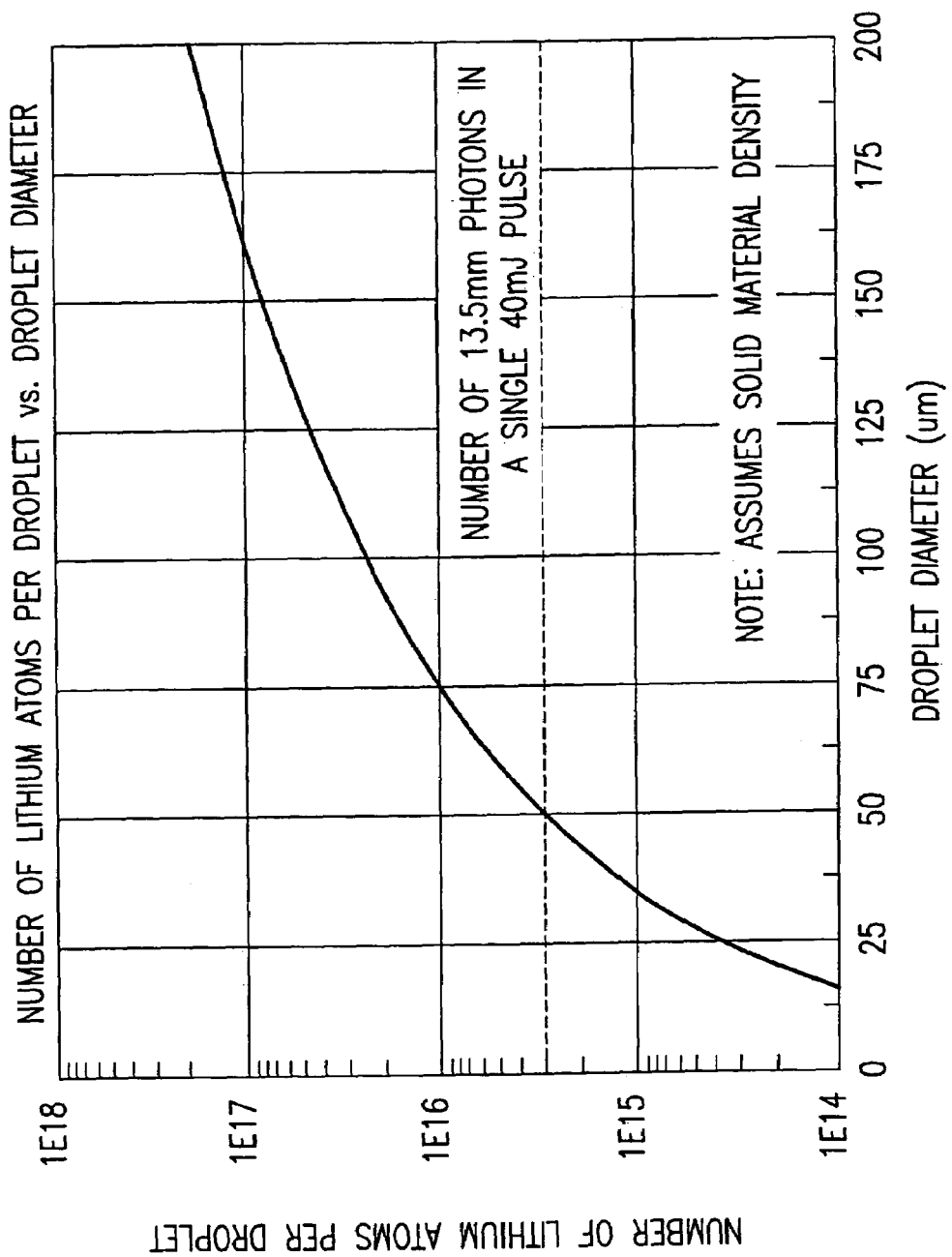
FIG. 10 shows a calculated number of lithium atoms per droplet vs. droplet diameter, useful in illustrating an aspect of an embodiment of the disclosed subject matter.

The number of atoms per droplet versus droplet size is shown in FIG. 10 Also shown in FIG. 10 is the number of 13.5 nm photons contained in, e.g., a single 40 mj pulse. The 40 mj pulse example assumes a 10% conversion efficiency into 4π steradians and a 400 mj laser pulse. The number of 13.5 nm photons per pulse is given by:

$$N_{Photons} = \frac{13.5\ nm\ OpticalPulseEnergy(mJ)}{E_{Photon}(eV) \cdot 1.6 \times 10^{-16}(mJ/eV)}; \quad \{7\}$$

where the 13.5 nm photon energy is 91.6 eV. The resulting number of photons for a 40 mj pulse is $2.72 \times 10^{15}$. A, e.g., 50 μm droplet has one lithium atom for every 13.5 nm photon. Normally one could assume multiple photons emitted from each emission element. This assumption would allow use of a smaller droplet diameter than 50 μm. A smaller droplet diameter can be important because the lithium usage and lithium deposition rates, e.g., on the collector optics, scale as the cube of the droplet diameter.

Assuming that there is no lithium recovery, according to a possible aspect of an embodiment of the disclosed subject matter, then calculating, e.g., the yearly usage of lithium is given by the number of pulses per year times the amount per pulse. Assuming, by way of example a repetition rate, RR, and a duty cycle, DC, the resulting mass usage is, e.g.,:

Mass Per Year=$M_{droplet}$·RR·60 sec/min·60 min/hr·24 hr/day·365 day/yr·DC  \{8\} i.e.,

Mass Per Year=$8.83 \times 10^{-6} \cdot d_{droplet}^3 \cdot RR \cdot DC$  \{9\};

where the droplet diameter is in micrometers and the resulting mass is in grams. For example, a system with no lithium recovery running at 6 kHz with a droplet diameter of 50 μm running at 100% duty cycle for a full year would consume 6,622 grams or about a 12.3 liter volume of lithium. A droplet diameter of 25 μm under similar conditions would consume only 828 grams or about 1.5 liters of lithium.

Assuming that the lithium droplet, once heated by the laser pulse, expands in all directions uniformly, the atomic flux will fall off as the square of the distance from the laser-droplet interaction point (ignition site). The number of atoms emitted from the interaction point per second is the number of atoms per droplet times the repetition rate:

Total Atomic Emission=$2.43 \times 10^{10} \cdot d_{droplet}^3 \cdot RR$  \{10\};

where the droplet diameter is in micrometers and RR is the laser repetition rate in Hz.

The atomic flux (atoms/cm²) through the surface an imaginary sphere centered at the ignition site will be the total atomic emission divided by the surface area in centimeters:

$$\text{Atomic Flux} = 1.93 \times 10^9 \frac{d_{droplet}^3 \cdot RR}{r_{sphere}^2}; \quad \{11\}$$

Figure 11:
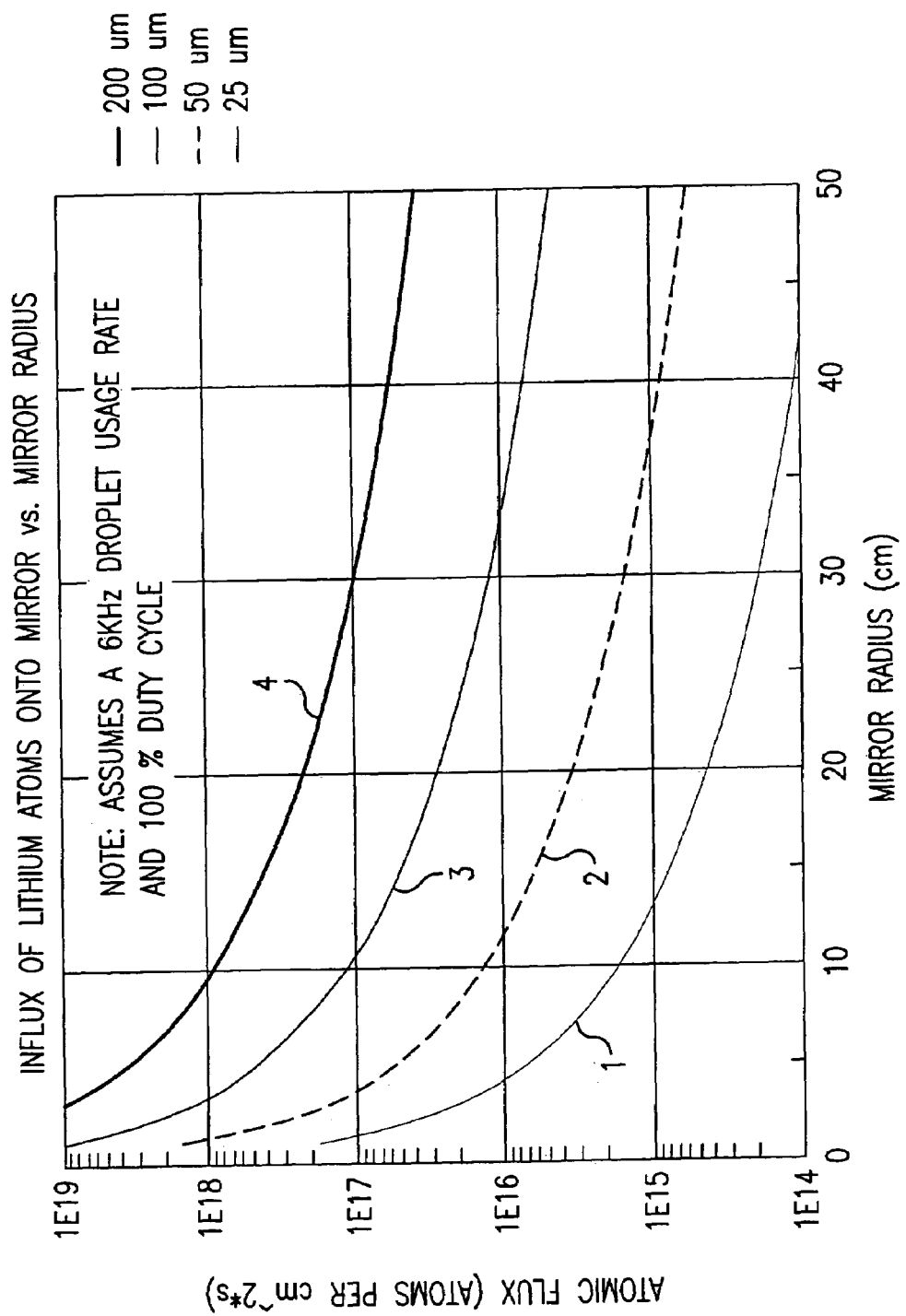
FIG. 11 shows a calculated influx of lithium atoms onto a mirror surface vs. mirror radius useful in illustrating an aspect of an embodiment of the disclosed subject matter.

The resulting flux is in units of atoms/cm² s. FIG. 11 shows the rate of lithium influx onto the mirror surface vs. mirror radius for several droplet diameters, i.e., (1) 25 μm. (2) 55 μm, (3) 100 μm and (4) 200 μm, assuming a 6 kHz repetition rate and 100% duty cycle.

In order to maintain high mirror reflectivity, the influx of lithium onto the mirror surface can, e.g., be exceeded by the sputter rate of lithium, e.g., caused by incident helium ions. In addition, for long mirror lifetime the sputter rate of molybdenum by these same, e.g., helium ions must then be many orders of magnitude slower than that for, e.g., lithium.

The required ratio of sputter rate of the first and second metals, e.g., molybdenum to lithium, in order to achieve, e.g., a 1 year lifetime for the multi-layer coated collector mirror can be calculated, e.g., by assuming use of, e.g., a multi-layer stack with 300 layer pairs, e.g., so that erosion of, e.g., the first 200 layer pairs leaves a still comfortably effective 100 good pairs, i.e., still maintaining high reflectivity. Also assumed is a sputter rate for the silicon layers that is much higher than that for the first metal, e.g., molybdenum layers and thus provides a negligible contribution to the mirror lifetime.

A typical EUV mirror can consist, e.g., of a layer pair of molybdenum and silicon with the molybdenum layer 2.76 nm thick, such that 200 pairs for sacrificial erosion gives, e.g., 552 nm of molybdenum erosion before end-of-life for this mirror. For a 1-year useful life, the molybdenum sputter rate must be below 552 nm/year, i.e., $1.75 \times 10^{-5}$ nm/sec.

The lithium sputter rate in terms of atoms per $cm^2$ per second (equal to the lithium influx rate derived above) converts to nm/sec from the thickness of a monolayer of lithium, given the atomic number density of lithium per its mass density and atomic weight, with appropriate unit conversions, as follows:

$$AtomicNumberDensity = \frac{\rho_{lithium}(g/cm^3)}{M_{lithium atom}(amu) \cdot \frac{1.6605 \times 10^{-24} g}{1\ amu}}; \quad \{12\}$$

where $\rho_{lithium}=0.535$ g/cm$^3$ and $M_{lithium\ atom}=6.941$ amu. The resulting atomic number density for lithium is $4.64 \times 10^{22}$ atoms/cm$^3$. If this number of lithium atoms where arranged in a cube with dimensions 1 cm on each side, then the number of atoms along an edge per cm would be the cube root of the atomic number density, $3.58 \times 10^7$ atoms/cm. The resulting monolayer thickness is $2.78 \times 10^{-8}$ cm or 0.278 nm. The number of atoms per cm$^2$ in a monolayer then is the square of the number of atoms along an edge per cm: $1.28 \times 10^{15}$ atoms/cm$^2$.

The number atoms of, e.g., lithium, removed by sputtering per second must match the influx rate given in Equation 11. Thus, the number of monolayers removed per second is equal to the influx rate divided by the number of atoms per cm$^2$ in a monolayer. Thickness removal rate is the monolayer removal rate times the thickness of a monolayer, i.e., $$ThicknessRemovalRate = MonolayerThickness(nm) \cdot \frac{InfluxRate(atoms/cm^2 s)}{NumberofAtomsinaMonolayer(atoms/cm^2)}. \quad \{13\}$$

Figure 12:
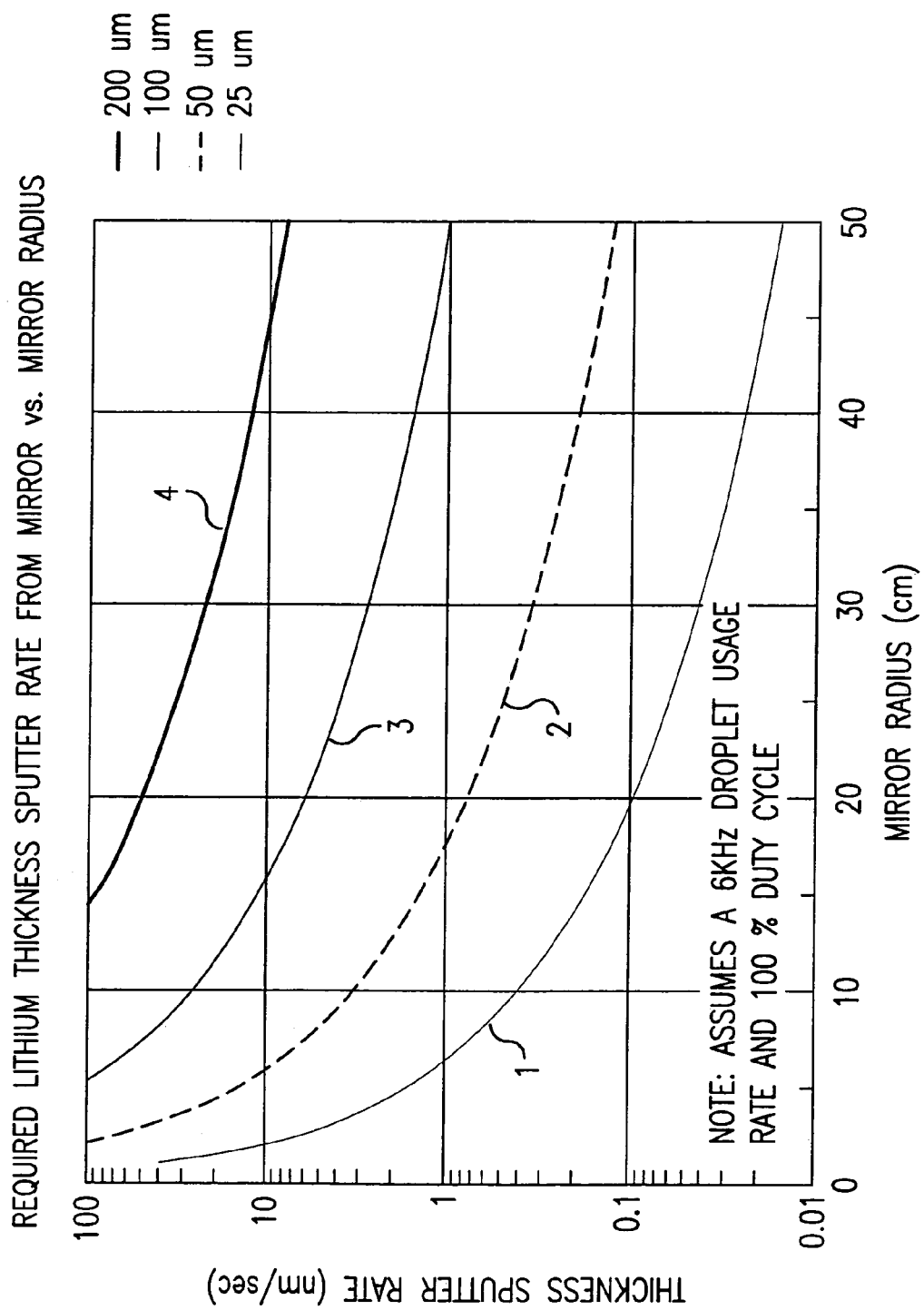
FIG. 12 shows a calculated required lithium thickness sputter rate vs. mirror diameter useful in illustrating an aspect of an embodiment of the disclosed subject matter.

Using the values for lithium:

$$LithiumThicknessRemovalRate = 2.17 \times 10^{-16} \cdot LithiumInfluxRate(atoms/cm^2\ s) \quad \{14\}$$

with the resulting units of nm/sec. The lithium influx rate shown in FIG. 11 converts to a required lithium thickness sputter rate, shown in FIG. 12, for the same 1-4 droplet sizes, repetition rate and duty cycle.

This result further highlights the need for a small droplet size and a large mirror radius. Otherwise, the required sputter rate can become impractical.

Figure 13:
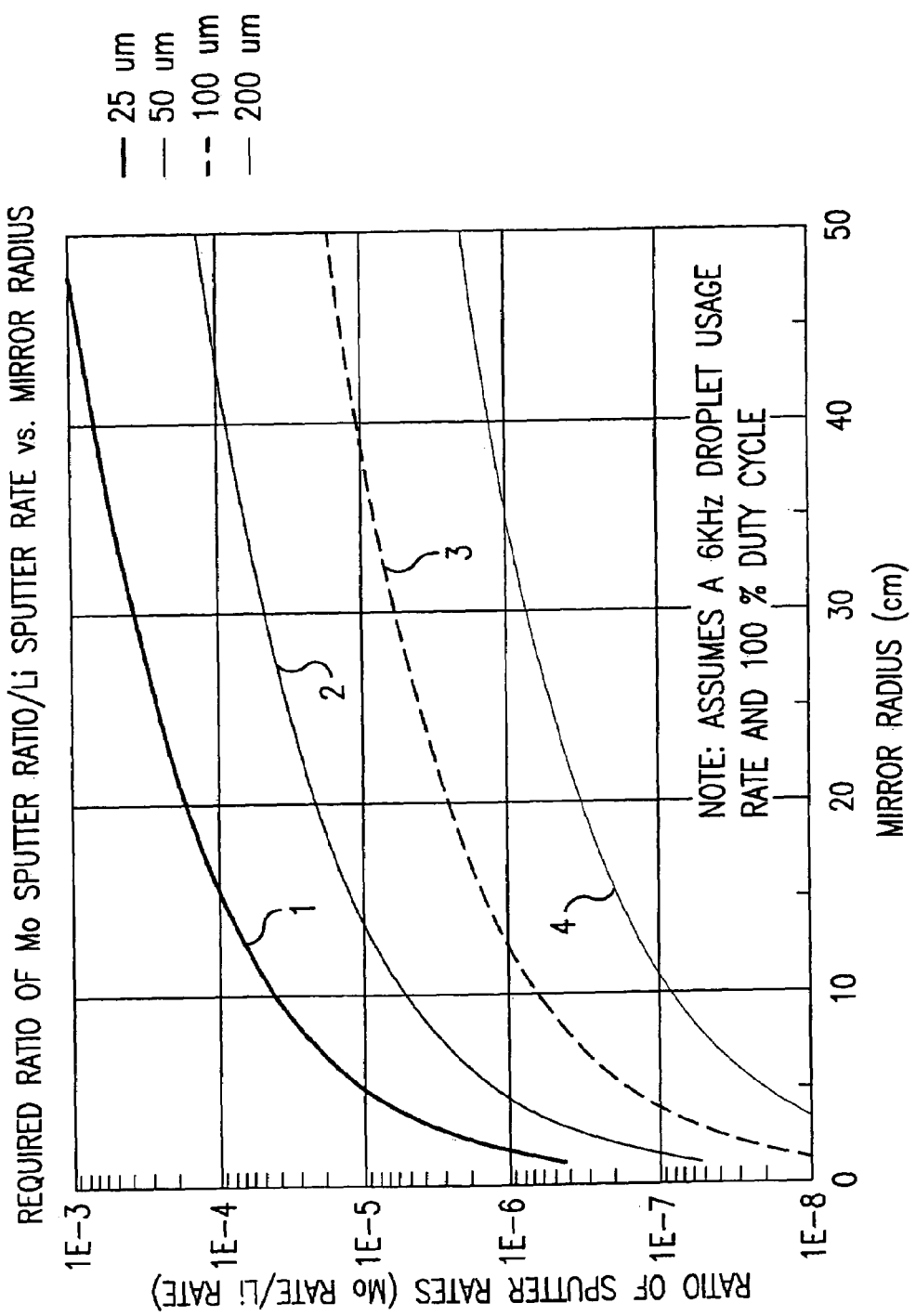
FIG. 13 shows a required ratio of molybdenum sputter rate to lithium sputter rate vs. mirror radius in order to have a 1-year life with a 300 pair multi-layer coated mirror useful in illustrating an aspect of an embodiment of the disclosed subject matter.

The required thickness sputter rate for lithium, can be compared to the maximum allowed thickness sputter rate for molybdenum, e.g., for a 1 year collector lifetime. The data in FIG. 12 divided into the maximum allowed molybdenum sputter rate, $1.75 \times 10^{-5}$ nm/sec is shown in FIG. 13 for the same 1-4 droplet sizes, repetition rate and duty cycle.

Figure 14:
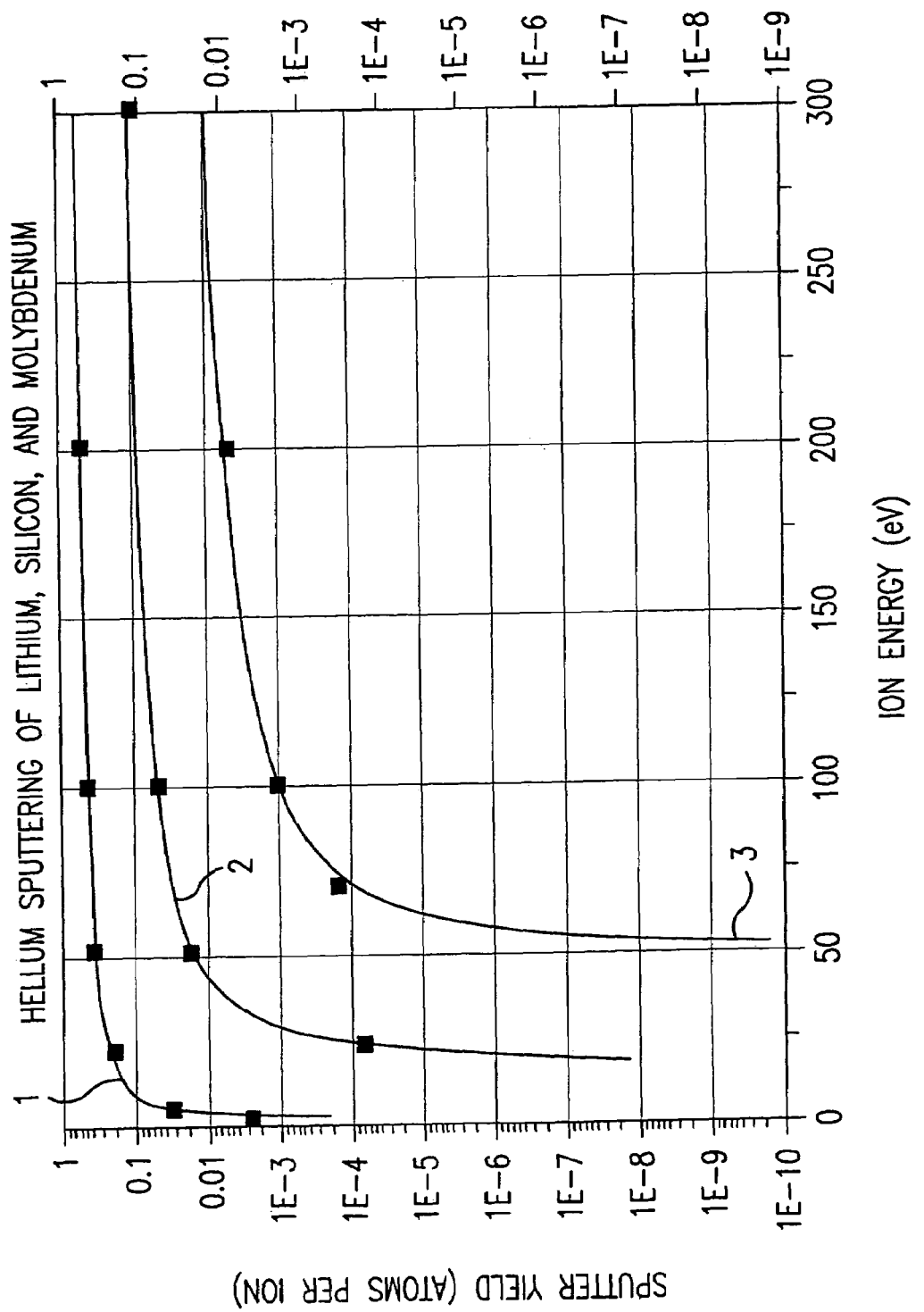
FIG. 14 shows sputter yield for lithium, silicon, and molybdenum with helium ions useful in illustrating an aspect of an embodiment of the disclosed subject matter.

The question is what is needed to create a molybdenum sputter rate 4 or more orders of magnitude less than the lithium sputter rate. The sputter yield for lithium and molybdenum when attacked by helium ions is discussed, e.g., in W. Eckstein, "Calculated Sputtering, Reflection and Range Values", [citation to publication?] published on, Jun. 24, 2002. This sputter yield data versus ion energy is shown in FIG. 14 along with data for silicon for ion energies of (3) lithium into Mo at Eth=52.7 eV, (2) helium into Si at Eth=10.1 eV and (1) helium into Li. As one can see, a properly chosen helium ion energy will result in acceptable lithium sputter yield and essentially no molybdenum sputter yield. A problem can arise, however, from the fact that one cannot control the incident ion energy perfectly. That is, the energy spectrum of incident helium ions is not a delta function. It is the spread of ion energies that must be assessed when determining the deferential sputtering between lithium and molybdenum.

There are examples in the literature of RF Induction (RFI) plasmas which create, e.g., an ion energy distribution that is Gaussian shaped with, e.g., a FWHM of 2.5 eV as discussed, e.g., in J. Hopwood, "Ion Bombardment Energy Distributions in a Radio Frequency Induction Plasma," Applied Physics Letters, Vol 62, No. 9 (Mar. 1, 1993), pp 940-942.

Figure 15:
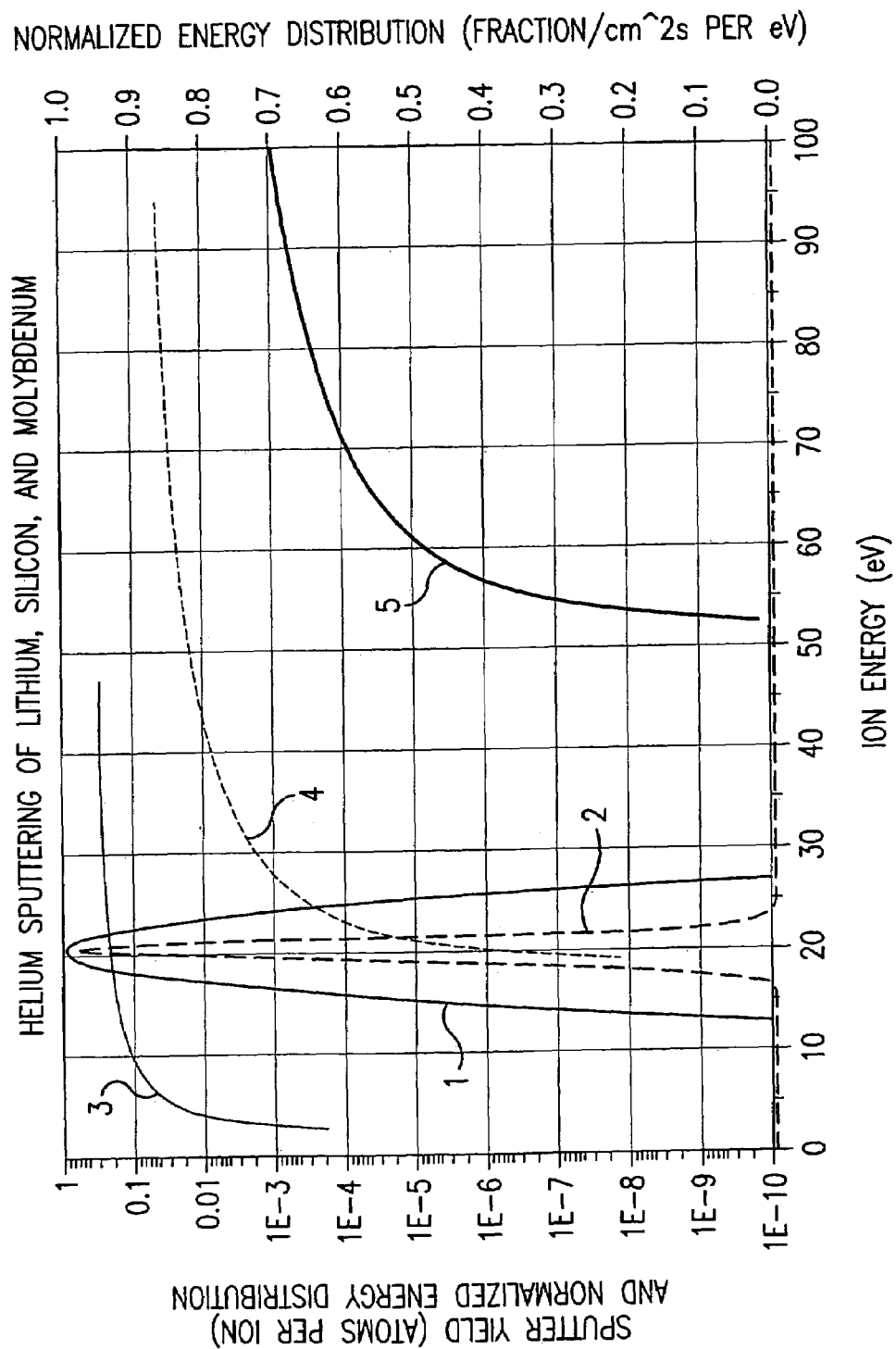
FIG. 15 shows normalized helium ion energy along with sputter yields for lithium, silicon, and molybdenum useful in illustrating an aspect of an embodiment of the disclosed subject matter.

The peak of the ion energy distribution can, e.g., be adjusted with proper choice of, e.g., electric field strength and helium pressure. By choosing, e.g., a peak ion energy of 20 eV, the helium ions have high sputter yield for lithium, but have energies safely below that of the molybdenum sputter threshold. In FIG. 15 there is shown a plot of normalized ion energy distribution (1 on the log scale and 2 on the linear scale) centered on 20 eV and FWHM of 2.5 eV along with the sputter yields for (3) lithium, (4) silicon, and (5) molybdenum. One can see that there are very few helium ions with energy above the molybdenum sputter threshold. To determine the sputter rate of molybdenum under these conditions requires calculating the influx of helium ions needed to maintain the mirror surface clean of lithium atoms. A constant sputter yield of 0.2 atoms per ion can be assumed, since the bulk of the distribution of helium ion energies falls within the region of nearly constant lithium sputter yield.

$$HeliumIonInflux(ions/cm^2 s) = \frac{LithiumInflux(atoms/cm^2 s)}{SputterYeild(atoms/ion)}. \quad \{15\}$$

Thus, the helium ion density must be 5 times the value of lithium influx density shown for various conditions in FIG. 11.

This helium ion influx expressed in Equation 15 may be considered to be the bare minimum, assuming, e.g., the lithium does not deposit perfectly uniformly. In this event a higher total sputter rate may be required, e.g., to ensure that islands of lithium do not develop. On the other hand, other researchers have shown that the ejection of material from an LPP plasma tends to travel toward the laser source. One can, therefore, e.g., arrange the system such that the laser illuminates the lithium droplet from a direction away from the collector, or through an aperture in the collector mirror that causes much of this debris to not strike the collector mirror. Thus, the total lithium load on the mirror may be reduced from the total theoretical amount striking the mirror.

Knowing the total flux of helium ions and assuming a Gaussian energy distribution with a peak at 20 eV and a FWHM of 2.5 eV, the integral of a normalized Gaussian distribution is $\sqrt{2\pi\sigma^2}$ where $\sigma^2$ gives a variance of the distribution related to the FWHM by:

$$\sigma^2 = \frac{(FWHM)^2}{4\ln(4)}. \qquad \{16\}$$

The integral of a normalized Gaussian then is $$\sqrt{\frac{\pi(FWHM)^2}{2\ln(4)}},$$

so that the peak current density of helium ions is given by:

$$PeakHeliumCurrentDensty(\text{ions/cm}^2\text{s per eV}) = \qquad \{17\}$$
$$\frac{HeliumIonInflux(\text{ions/cm}^2\text{s})}{\sqrt{\frac{\pi(FWHM)^2}{2\ln(4)}}}.$$

Figure 16:
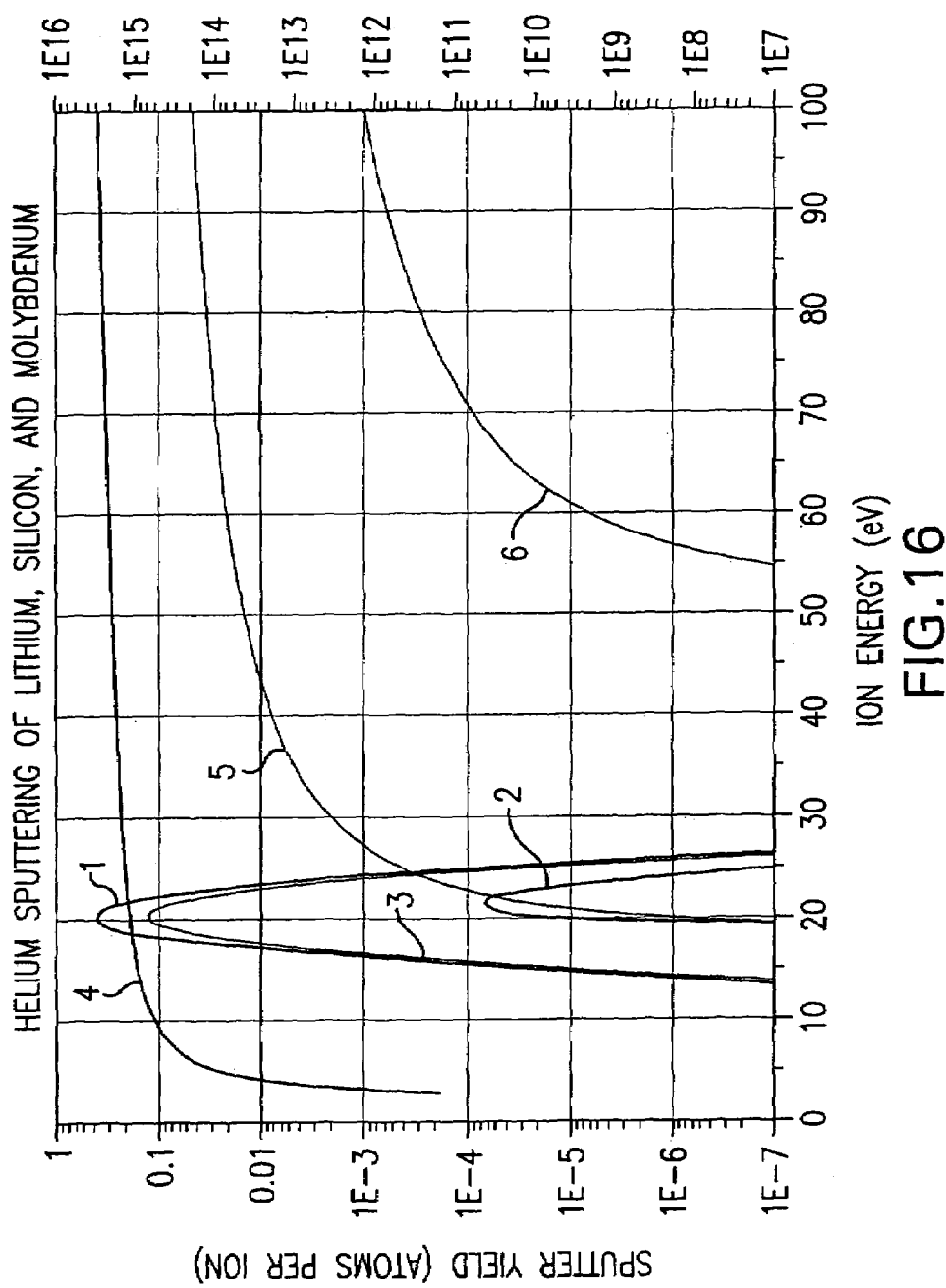
FIG. 16 shows helium ion current density along with the sputter yield of lithium, silicon, and molybdenum useful in illustrating an aspect of an embodiment of the disclosed subject matter.

Taking the case of a 25 μm droplet with a mirror radius of 10 cm, the peak helium current density must be $3.38\times10^{15}$ ions/cm²s per eV in order to sputter a total of $1.88\times10^{15}$ lithium atoms/cm²s. This helium current density distribution (1) is plotted in FIG. 16 on a log scale, with (2) silicon sputter density and (3) lithium sputter density, along with empirically determined sputter yield of (4) lithium, (5) silicon, and (6) molybdenum and the product of these functions times the ion current density. A surprisingly beneficial result of this analysis shows that the peak sputter density for molybdenum is $3.5\times10^{-205}$ atoms/cm²s per eV (not shown on graph), an incredibly small value. In fact, even the peak silicon sputter density is more than 3 orders of magnitude smaller than that for lithium.

Figure 17:
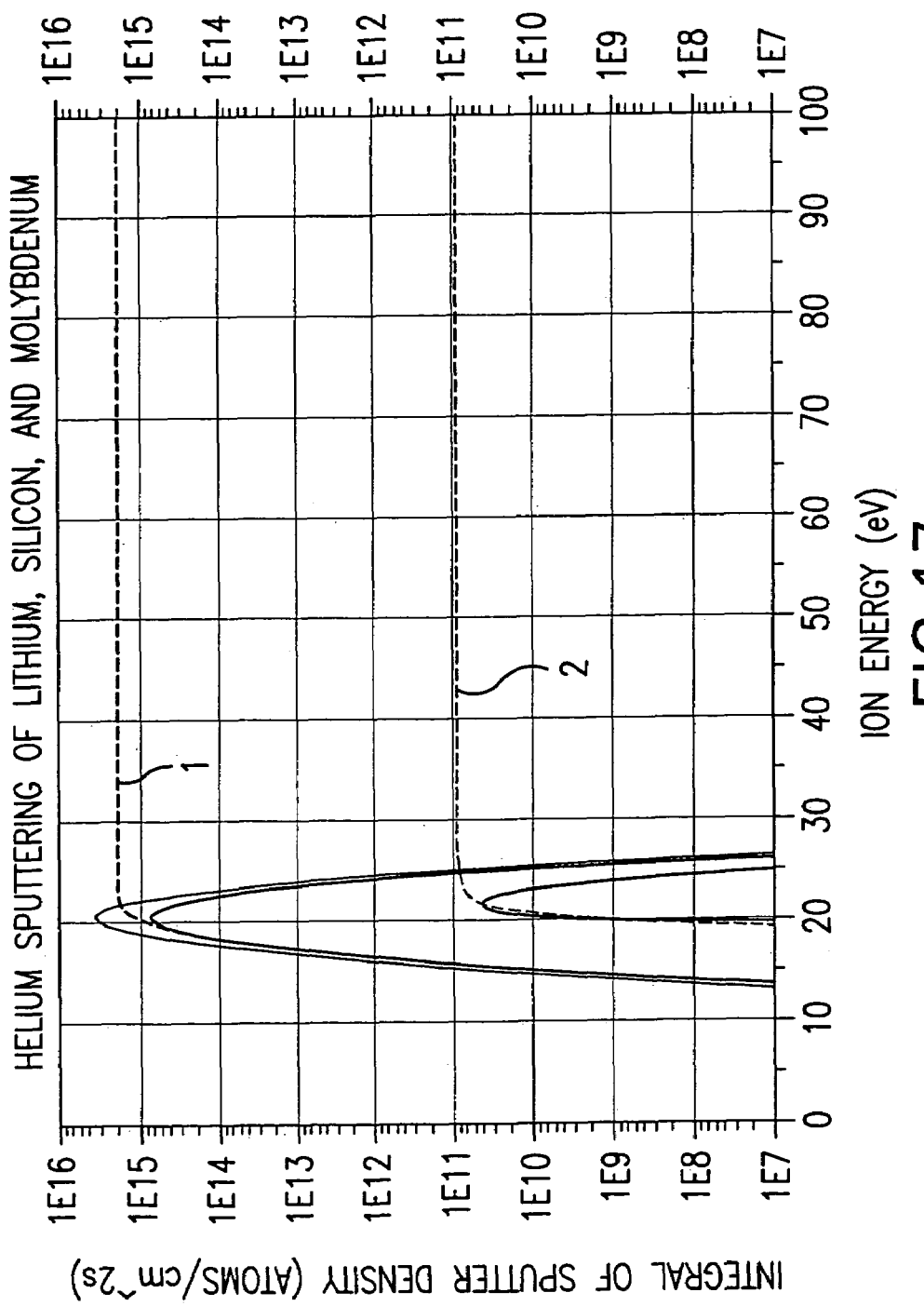
FIG. 17 shows total helium ion sputter rates for lithium, silicon, and molybdenum useful in illustrating an aspect of an embodiment of the disclosed subject matter.

The integral of these sputter densities over all helium ion energies gives the total sputter rate. These integrals are shown respectively as dashed curves (1) for lithium and (2) for silicon, in FIG. 17. The integrated lithium sputter density is $1.88\times10^{15}$ atoms/cm²s, matching the lithium influx rate. The integrated silicon sputter density is $9.17\times10^{10}$ atoms/cm²s. The integrated molybdenum sputter density is $1.16\times10^{-205}$ atoms/cm²s. Therefore, differential sputter rates between molybdenum and lithium are so low that, e.g., less layers of the collector mirror need be employed, e.g., many less that a previously anticipated 300 base pair mirror concept. A single molybdenum layer will last more than a year under these conditions and the assumptions of this sputter yield model. This performance could be even more improved using a debris shield between the ignition spot and the collector main mirror or main an secondary mirrors, but the debris shield, as seen from these results, may also be totally eliminated, at least for a lithium target. This type of stimulated plasma induced ionized sputtering of debris from the EUV optics, especially for a lithium target, as seen from the above, could even allow for use of other target types, e.g., a moving tape or other type of moving solid target system. Helium ion sputtering can be arranged such that it removes the lithium atoms from the collector mirror at a sufficient rate while sputtering molybdenum at a low enough rate for far greater than 1 year lifetime.

Figure 18:
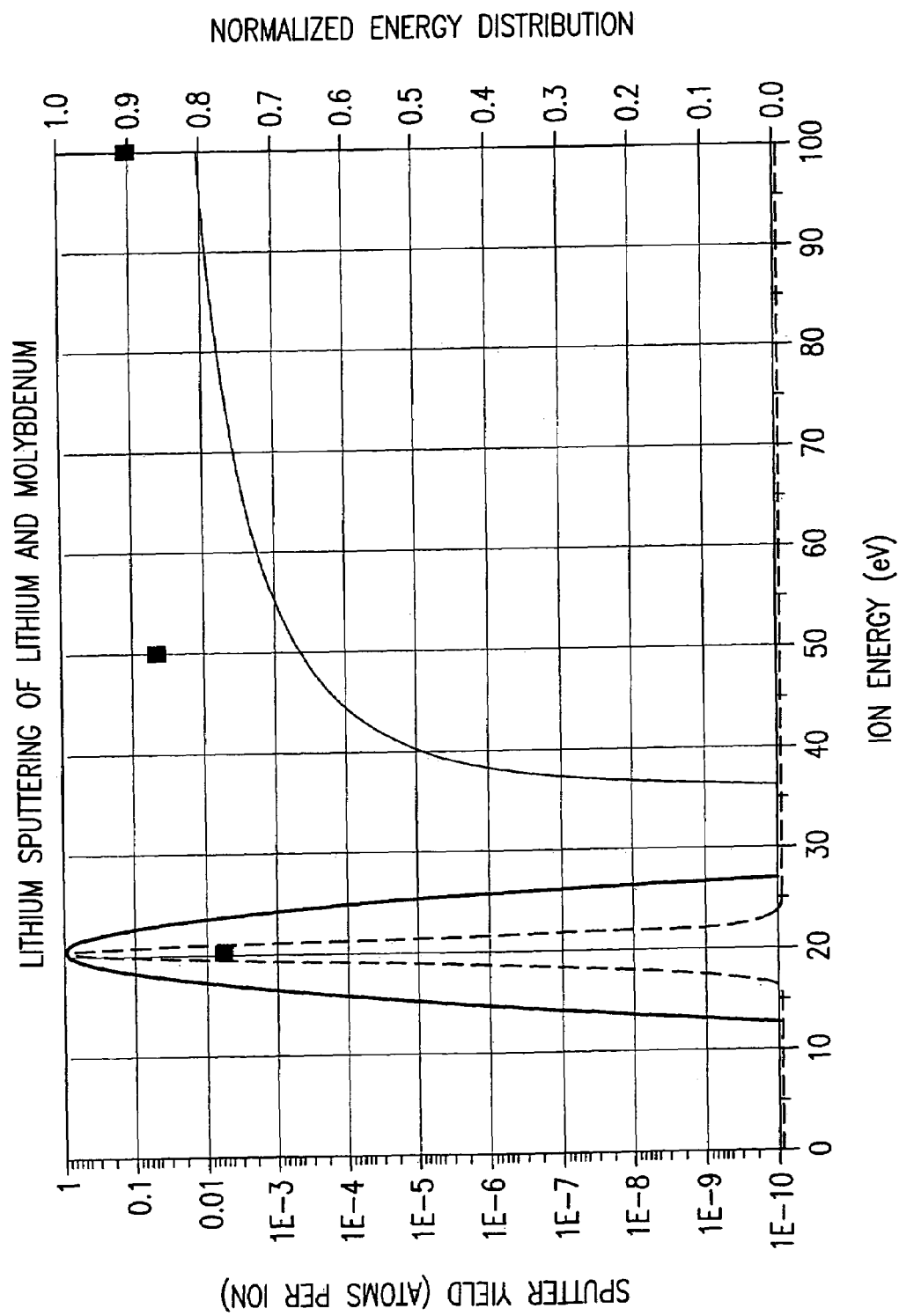
FIG. 18 shows normalized lithium ion energy along with sputter yields for lithium and molybdenum useful in illustrating an aspect of an embodiment of the disclosed subject matter.

Sputtering of molybdenum by, e.g., lithium ions must also be considered in the embodiment of the disclosed subject matter being discussed, since, e.g., there will be lithium ions formed a debris from the ignition plasma which do not reach the optic surface, but which will be available to the sputtering plasma and will be accelerated toward the mirror surface with a similar energy distribution as the helium ions. The literature also provides data on sputter yield of lithium and molybdenum with lithium ions. This data is shown in FIG. 18 in curve 1 for lithium at Eth=36.3 eV, along with the same normalized lithium ion energy distribution as was used for the helium ions. To calculate the molybdenum sputter density from lithium the total lithium ion influx must be known. Unlike this calculation for helium (Equation 15) it is not clear what the total lithium influx will be, however, a conservative choice would the total lithium atomic influx generated by the LPP ignition plasma. Using Equation 17 and the assumptions of a 25 μm droplet and a 10 cm mirror radius, $1.88\times10^{15}$ lithium ions/cm²s would be incident on the mirror, and the peak lithium ion current density is $7.06\times10^{15}$ lithium ions/cm² s per eV, with the assumption of a 2.5 eV FWHM spread in incident ion energy, which, when multiplied by the sputter yield for molybdenum and integrated over all ion energies, gives a total molybdenum sputter density of $2.54\times10^{48}$ atoms/cm²s. This is much higher than that for helium ions, but still much, much lower than the rate required for one year of useful life.

The molybdenum sputter density with lithium ions can be converted to thickness loss rate by using Equations 12 and 13. For molybdenum:

$\rho_{moly}$=10.2 g/cm³

$M_{moly\ atom}$=95.94 amu=$1.59\times10^{-22}$ g

Moly Atomic Number Density=$6.40\times10^{22}$ atoms/cm³

Moly Monolayer Thickness=$2.50\times10^{-8}$ cm=0.250 nm

Moly Monolayer Atomic Density=$1.59\times10^{15}$ atoms/cm²

Thus, the sputter thickness rate for molybdenum, when attacked by lithium atoms, is $3.99\times10^{-64}$ nm/sec or $1.25\times10^{-56}$ nm/year. This also leads to the conclusion that the above noted beneficial results of the sputtering plasma ionized cleaning of the EUV optics by, e.g., helium ion sputtering are still realizable even with, e.g., lithium sputtering of molybdenum.

An additional beneficial result is the reconsideration of the previously proposed use of, e.g., a ruthenium capping layer on, e.g., the multi-layer mirror. A ruthenium capping layer has been proposed to prevent EUV-assisted oxidation of the first silicon layer in the Mo/Si stack. Multi-layer mirrors are usually terminated with a silicon layer rather than a molybdenum layer because the molybdenum layer would quickly oxidize once exposed to room air. Applicants, before the above analysis regarding sputtering plasma cleaning of the EUV optics had considered, e.g., a multi-layer mirror terminated with silicon, with the expectation that the first layer of silicon would be eroded to expose the first layer of molybdenum or a ruthenium capping layer to avoid oxidation of a first layer of molybdenum if that approach was taken. The super-slow erosion rate of molybdenum, and a similar expected low erosion rate for ruthenium allows for use of a ruthenium capping layer expected to last for the useful life of the mirror. This results in no loss of the first layer of silicon, and no need to worry about what havoc the sputtered silicon atoms might cause, and no oxidation problems with an exposed molybdenum layer. The sputter yield of ruthenium with lithium and helium, although expected to be similar to that of molybdenum, since ruthenium has a higher atomic mass than molybdenum, remains to be determined.

The minimum RF power needed to create the desired sputtering plasma at or near the optic surface can be calculated by assuming, e.g., that every helium ion that is created strikes the collector mirror, which will underestimate the required RF power, but should give an order of magnitude estimate. Each helium ion that strikes the collector mirror requires 24.5 eV to ionize, and according to the above example of an embodiment of the disclosed subject matter has to have an average kinetic energy of 20 eV when it reaches the collector mirror. These two energy values times the required influx of helium ions, $9.40 \times 10^{15}$ ions/cm²s from Equation 15, gives the plasma power. Converting energy units from eV to J gives a minimum plasma power density of 66.9 mW/cm². Multiplying by the half the surface area of the 10 cm radius mirror, 628 cm², gives 42 W of minimum total plasma power. Assuming conservatively that only 1% of the plasma power is effectively used, the required plasma power calculated is 4.2 kW, which is acceptable, especially considering the very large area over which this power can be dissipated. This estimate of plasma power compares to the previous assumptions of 400 mJ per pulse at 6 kHz LPP laser power, 2.4 kW of laser power and assuming the collector mirror subtends π steradians, it will be exposed to half of this laser power, i.e., 1.2 kW. The thermal load from the LPP is similar to the thermal load of the plasma cleaning. The sum of the two powers is 5.4 kW, resulting in a power density on the mirror of 8.6 W/cm². Applicants believe that a collector mirror exposed to a 10 W/cm² or less power density is easily cooled, e.g., with water channels along the back of the mirror, or between the grounded shield and the mirror.

If the plasma power effectivity is more like 10%, then the total power density onto the mirror is only 2.6 W/cm², making it possible to radiatively cool the mirror, according to Stefan's law of radiation, which states that the power radiated per square meter from a black body at temperature T is given by:

$$P = 5.67 \times 10^{-12} \cdot T^4 \quad \{18\};$$

where temperature is in Kelvin and the resulting power density is in W/cm², which is plotted in FIG. 19. A temperature in excess of 500° C. would be required to radiate all of this incident power, so active cooling of the collection mirror appears to be required in order to prevent damage to the multi-layer stack.

Figure 20:
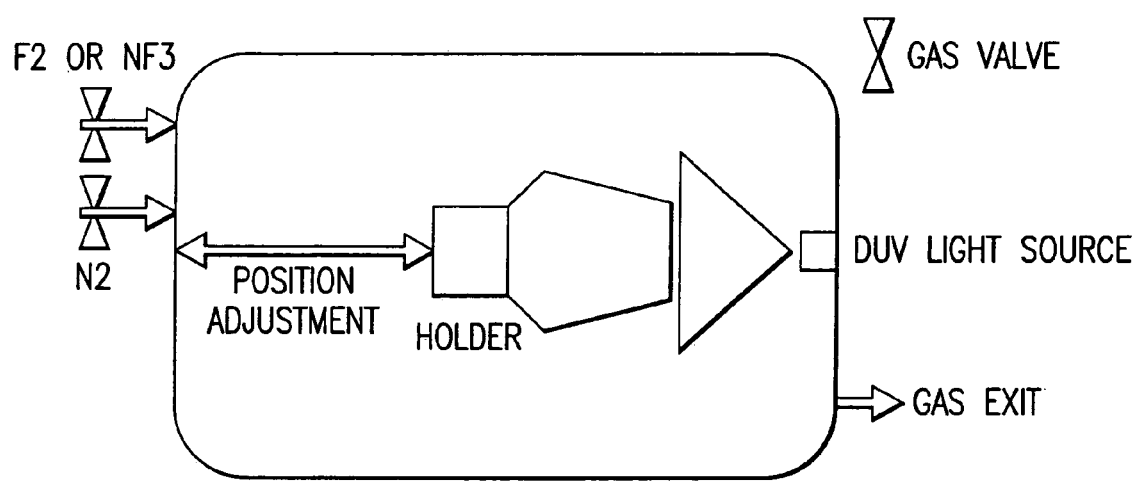
FIG. 20 shows a schematic view of an aspect of an embodiment of the disclosed subject matter.

Turning now to FIG. 20 there is shown an schematically an apparatus and method according to an embodiment of the disclosed subject matter for reclaiming damaged EUV optics, e.g., those that have lost reflectivity, e.g., due to deposition of material on the reflective surface, e.g., carbon and/or carbon based molecules, which may come from, e.g., contamination entering the EUV plasma chamber or from sputtering or photonic removal from layers of the multi-layer reflective stack coated on reflecting surfaces un the EUV apparatus. As can be seen in FIG. 20 a photo-chemical cleaning apparatus 400 may include a chamber, within which may be mounted, e.g., a collector holding jig 402 that is adapted to hold a collector for cleaning. Also included may be, e.g., a source of photonic energy, e.g., a DUV light source 410, with the collector holding jig 402 and the light source 410 arranged so that the light from the light source 410 simulates light coming from a point source at the focus of the collector, e.g., the ignition site 28 discussed above, such that the collector 404 is irradiated as if by light from a target ignition site.

According to an embodiment of the disclosed subject matter, e.g., the chamber 401 may first be purged by the use of nitrogen provided to the chamber through $N_2$ valve and then evacuated from the chamber 401 using gas exit valve, followed by the introduction of a fluorine containing gas, e.g., molecular $F_2$ or $NF_3$. The collector 404 may then be subjected to irradiation by the light source, e.g., DUV light at a range of λ between, e.g., 160-300 nm, e.g., from a KrF excimer laser at 193 nm, e.g., in a MOPA configuration for high power at about 40 W, with a pulse repetition rate at about 4 kHz. This can serve, e.g., to stimulate the production of, e.g., fluorine based carbon materials, e.g., $CF_4$, e.g., in a gas phase, which can then be evacuated from the chamber 401 through the gas exit valve 420 under a second nitrogen purge.

An alternative of a KrF DUV light source could be, e.g., a commercially available DUV lamp, e.g., a KrCl DUV lamp.

Applicants expect that thicknesses of about 3.5 nm carbon atom deposition on an EUV optic, e.g., a collector reflective surface can reduce reflectivity by about 5% and a 10 nm deposition by about 14%. Such levels of thickness of deposit are expected to be removed from, e.g., the collector optics reflective surfaces under treatment in fluorine with selected concentrations and the above referenced level of DUV light for a selected time. The process could also employ replenishing the fluorine supply with a gas flow control valve (not shown) to maintain, e.g., a desired concentration of fluorine during the cleaning process.

Applicants herein also propose according to an aspect of an embodiment of the disclosed subject matter that other types of barrier materials may be used in the multi-layer reflecting mirror stacks to help improve the thermal stability and reflectivity of, e.g., Mo/Si reflective stacks, e.g., optimized for 13.5 nm EUV light reflectivity. To promote smoothness of very thin, e.g., 1 nm barrier layers, that are compatible with, e.g., Mo/Si and perhaps also $MoSi_2$, retaining the appropriate levels of transparency to, e.g., 13.5 nm light, applicants propose the use of inter-diffusion barrier layers comprising carbides selected from the group comprising ZrC, NbC, SiC, borides, e.g., selected from the group $ZrB_2$, $NbB_2$, disilicides selected from the group comprising $ZrSi_2$, $NbSi_2$ and nitrides BN, ZrN, NbN and $Si_3N_4$. Other such layers could include yttrium, scandium, strontium compounds and/or these metals in pure form. Among the above, the carbides and borides mentioned are preferred due to the ability to create smoother diffusion barrier layers with such materials.

According to aspects of an embodiment of the disclosed subject matter applicants contemplate multi-layer stacks, including e.g., $MoSi_2$/Si, $Mo_2C$/Si, Mo/C/Si/C and Mo/X/Si/X, where the first two are MLMs where $MoSi_2$ or $Mo_2C$ is used in place of the Mo normally used in normal Mo/Si mirror coatings, with no inter-diffusion barriers. The other two are with the so-called inter-diffusion barriers, where C refers to carbon and X refers to a suitable material, including further compounds, e.g., the above noted borides, disilicides, and nitrides as the X materials. Nitrides are currently preferred embodiments according to applicants for inter-diffusion barrier layers in the applications according to embodiments of the disclosed subject matter. $Mo_2Si/Si$ is described in the paper Y. Ishii et al. "Heat resistance of Mo/Si, $MoSi_2/Si$, and $Mo_5Si_3/Si$ multilayer soft x-ray mirrors", J. Appl. Phys. 78, (1995) p. 5227.

Helium has high transparency to EUV, which makes it a good choice for a buffer gas for which a transmission of 90% is representative. Based on the partial pressures required for efficient sputtering, a few mTorr, helium buffer gas transmission would be nearly 100%. A possible collector multilayer surface could comprise, e.g., 300 coating pairs instead of the normal 90 pairs. The extra pairs would not improve the reflectivity over a 90 pair mirror, but instead these extra layers can, if required, get used once the top layers are eroded away. With a 300 pair mirror the sputter rate differential between lithium and the mirror need not be so high that a single mirror layer lasts for, e.g., months at a time. Instead three could be, e.g., an extra 210 layer pairs worth of mirror erosion that can be sustained.

Lithium chemical compounds that might be generated in the LPP vessel, e.g., LiH, LiOH, $Li_2CO_3$, etc., can have melting points in excess of 600° C. and thus may not be evaporated from the mirror. These could even form in certain cases, e.g., a crust over the lithium which deposits on the mirror surfaces. These could, however, very effectively be sputtered by the sputtering ion plasma, e.g., containing the ionized He atoms, or may be sputtered by lithium itself in the form of high speed lithium ions and atoms ejected from the plasma that impinge on the reflecting surface.

The sputter rate required to stay ahead of the lithium deposition could be much higher in an EUV light source than the literature indicates is typically practiced, e.g., in modern deposition and etch machines, which is at lease part of a reason for, e.g., a combined approach to keeping the, e.g., lithium off of the mirror surfaces. According to an aspect of an embodiment of the disclosed subject matter applicants contemplate using evaporation to remove the bulk of the lithium while employing a very light sputter rate to remove the inevitable lithium and carbon compounds deposited on the mirror surface. However, even a very light sputtering plasma impinging on at least the main and secondary reflecting surfaces could have the same beneficial carbon and other lithium compound removal properties. Employing this idea beyond the intermediate focus, e.g., in the illuminator reflective surfaces and also the projection reflecting surface may also prove beneficial to remove debris that happens to reach the lithography tool reflecting surfaces. In the lithography tool itself, due to, e.g., smaller deposition rates the thermal load and sputtering rate may be sufficiently low for this to be effective.

Sputtered lithium and lithium compounds along with lithium ejected from the plasma that does not collect on the reflecting surface may be trapped in cold fingers [not shown] contained in the EUV light source vessel, e.g., in the form of cooled, e.g., water cooled fins or plates extending from the inside walls of the vessel, and out of the optical path from the collector to the intermediate focus.

In the case of, e.g., tin as the source element it may be possible to use, e.g., a hydrate of the metal, e.g., $SnH_4$, which is a vapor at room temperature, along with a hydrogen plasma for cleaning the collector in a tin-based LPP source. Hydrogen has high 13.5 nm transmission and the resulting $SnH_4$ could be pumped away rather than trapped on cold fingers like the lithium.

Figure 21A:
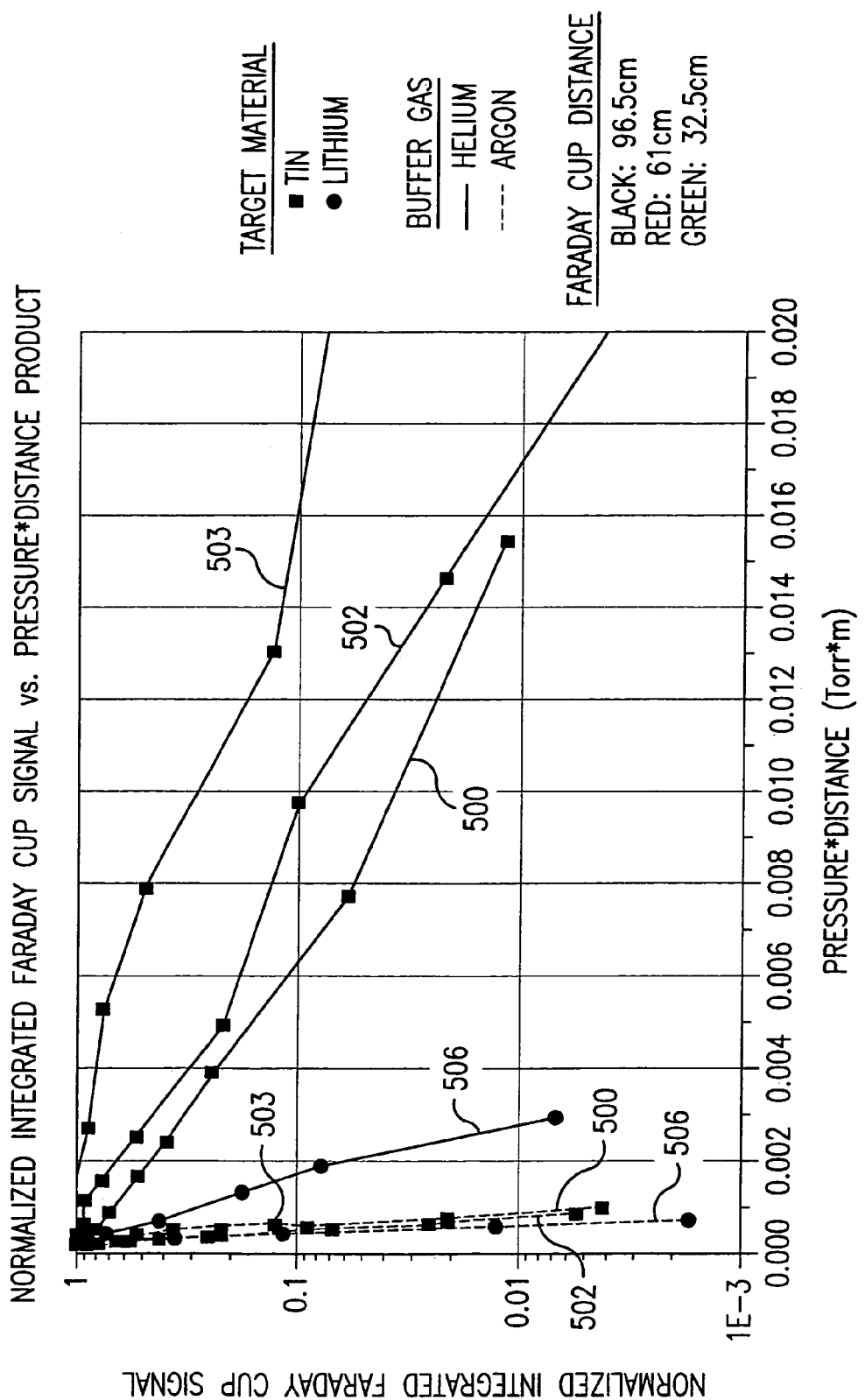
FIGS. 21A and B show results of experiments regarding the stopping power of helium and argon buffer gases against both tin and lithium ions according to aspects of an embodiment of the disclosed subject matter; and, FIGS. 22A-E show results of further examination of the stopping power of helium and argon buffer gases against both lithium and tin according to aspects of an embodiment of the disclosed subject matter.
Figure 21B:
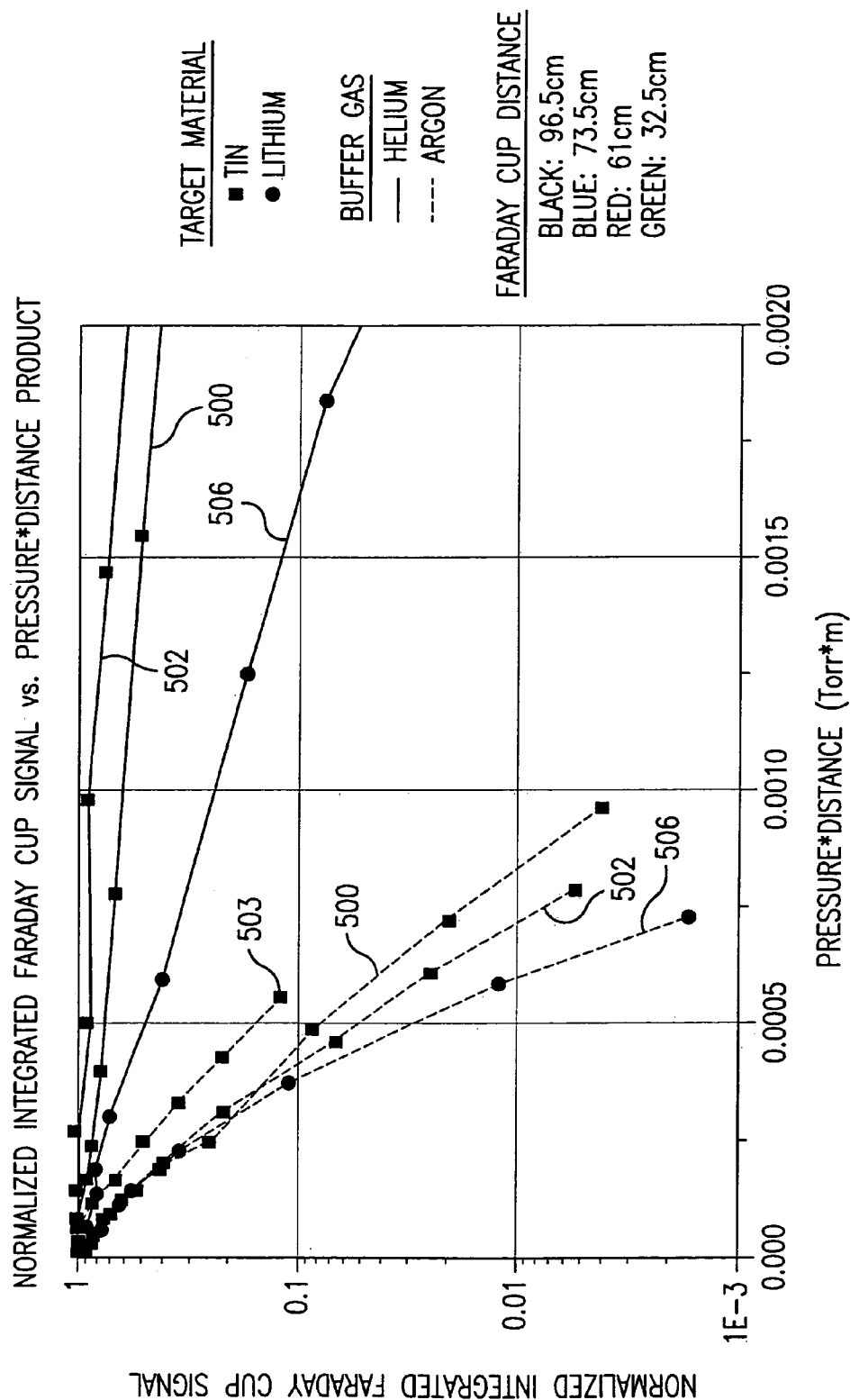

Applicants have examined, e.g., the stopping power of helium and argon against both tin and lithium ions. The results are shown in FIGS. 21A and B. The two graphs have the same data, just different scales. Lines 500, 502 and 503, for tin at different measured distances from a source plasma, respectively 96.5 cm, 61 cm and 32.5 cm with solid being helium buffer and dashed being argon buffer. The lines 506 are for lithium. If pressure*distance product scaling were applied, these three sets of for tin data would fall approximately on top of each other.

Applicants have also determined that Argon has at least 10 times higher stopping power than helium for a given gas pressure. Also, lithium can be stopped with less buffer gas than tin. And, scaled to the true working distance of an LPP collector (~10 cm), the required buffer pressure, even with argon, will need to be in the range of about 10 mT for tin. Since xenon and tin have nearly the same atomic mass, applicants expect that the required buffer pressure for a xenon LPP would also be in the range of 10 mT. Such a high buffer gas pressure can present EUV self-absorption problems for xenon and tin. But not for lithium, both because of the lower buffer pressure requirement and also the lower EUV absorption of lithium.

Figure 22A:
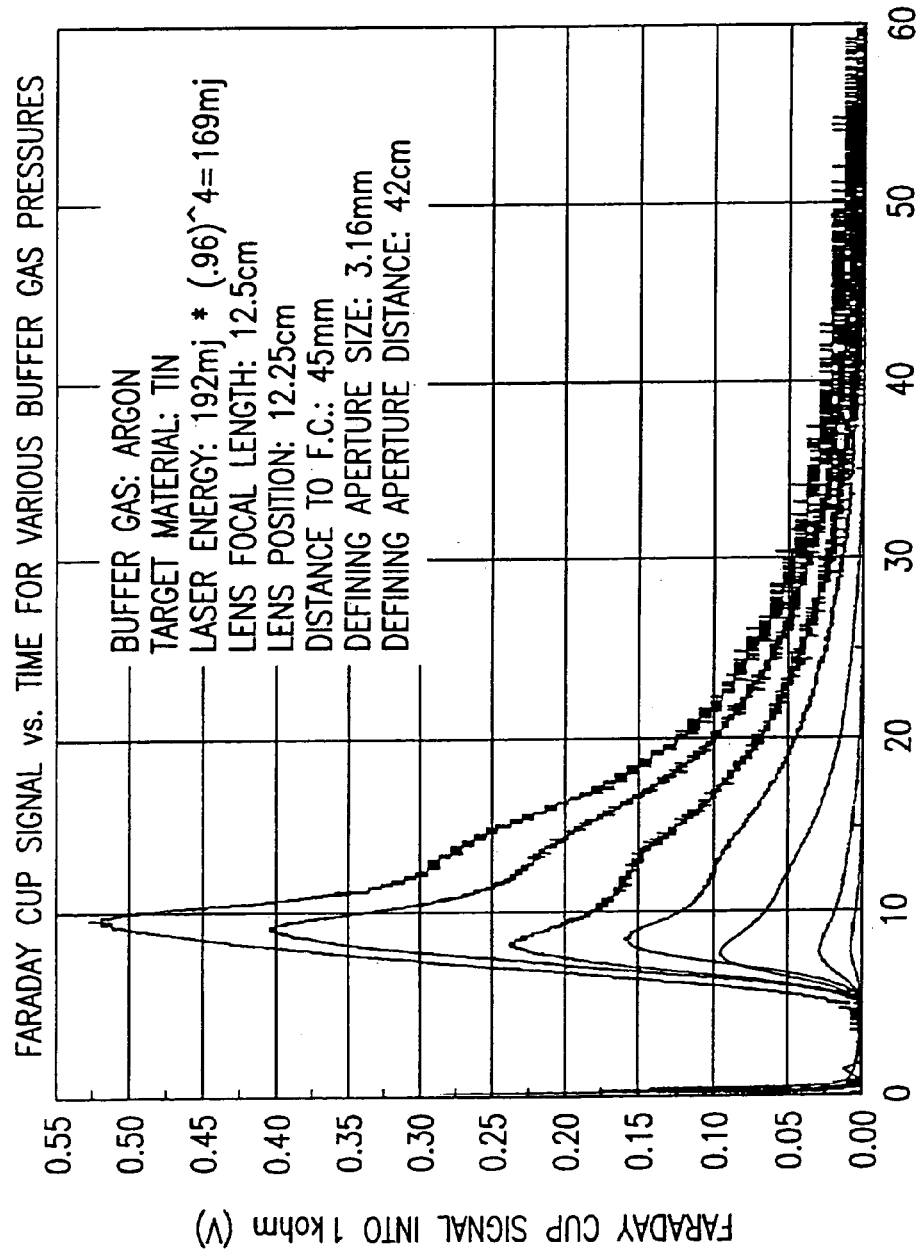
Figure 22B:
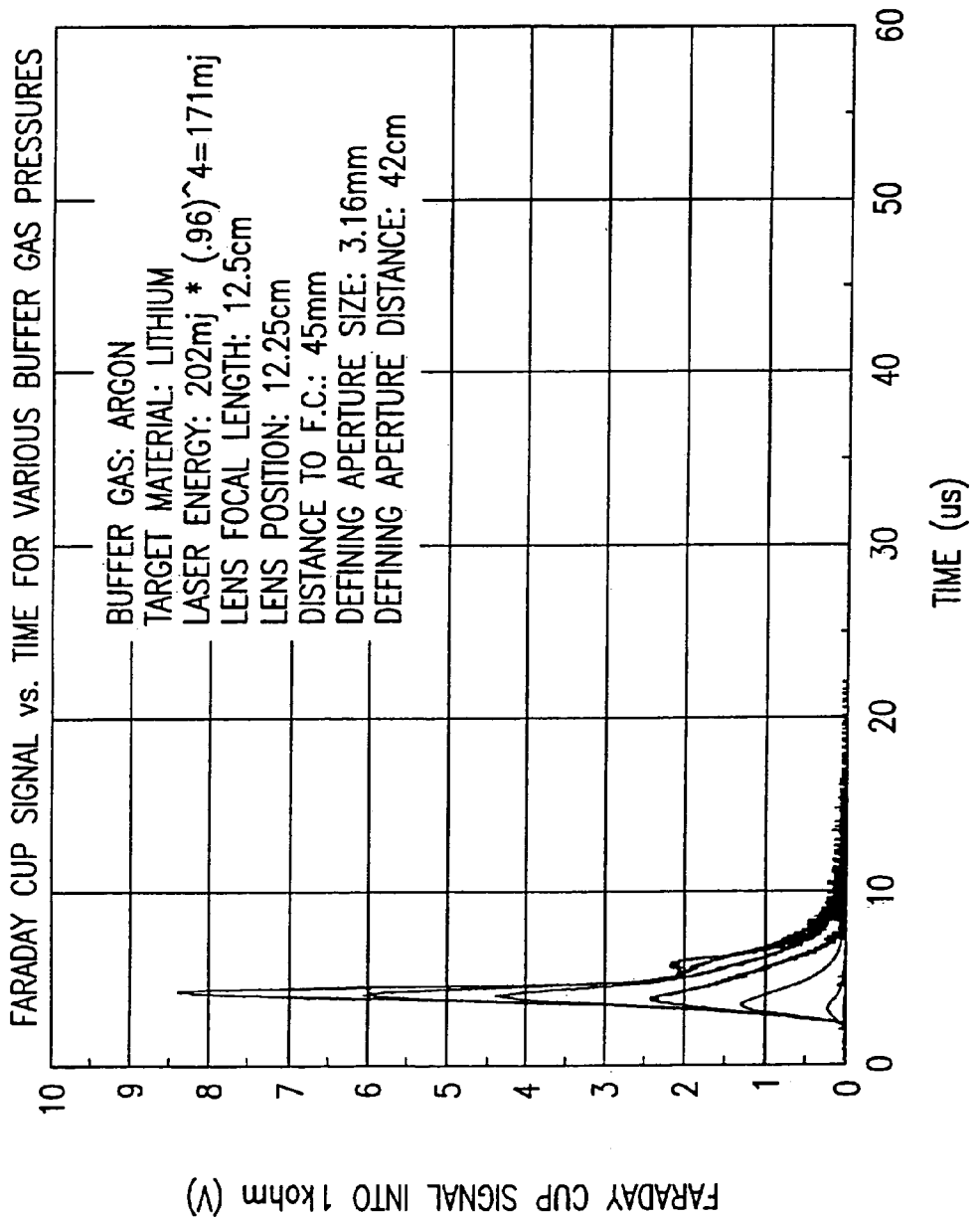
Figure 22D:
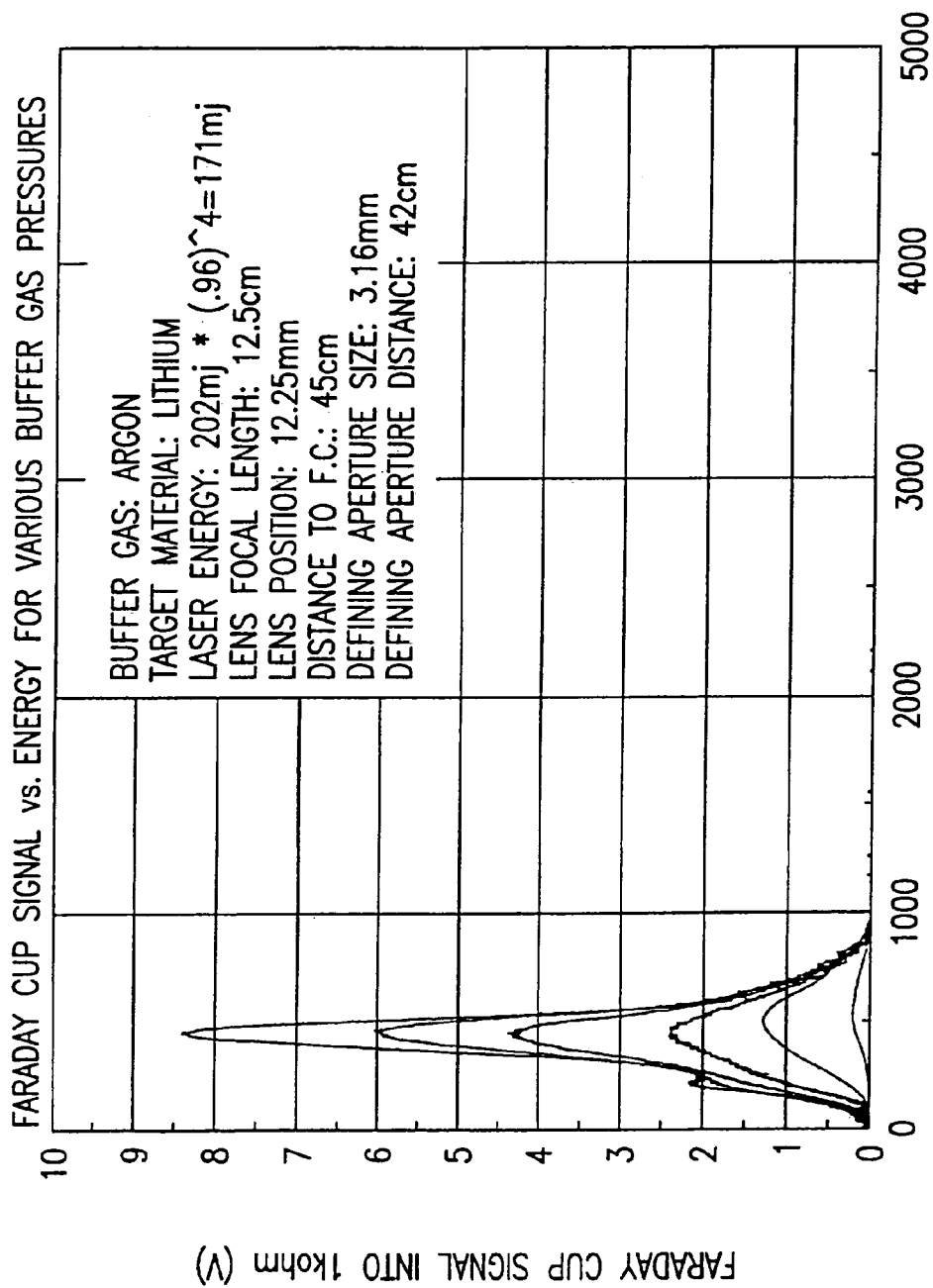
Figure 22E:
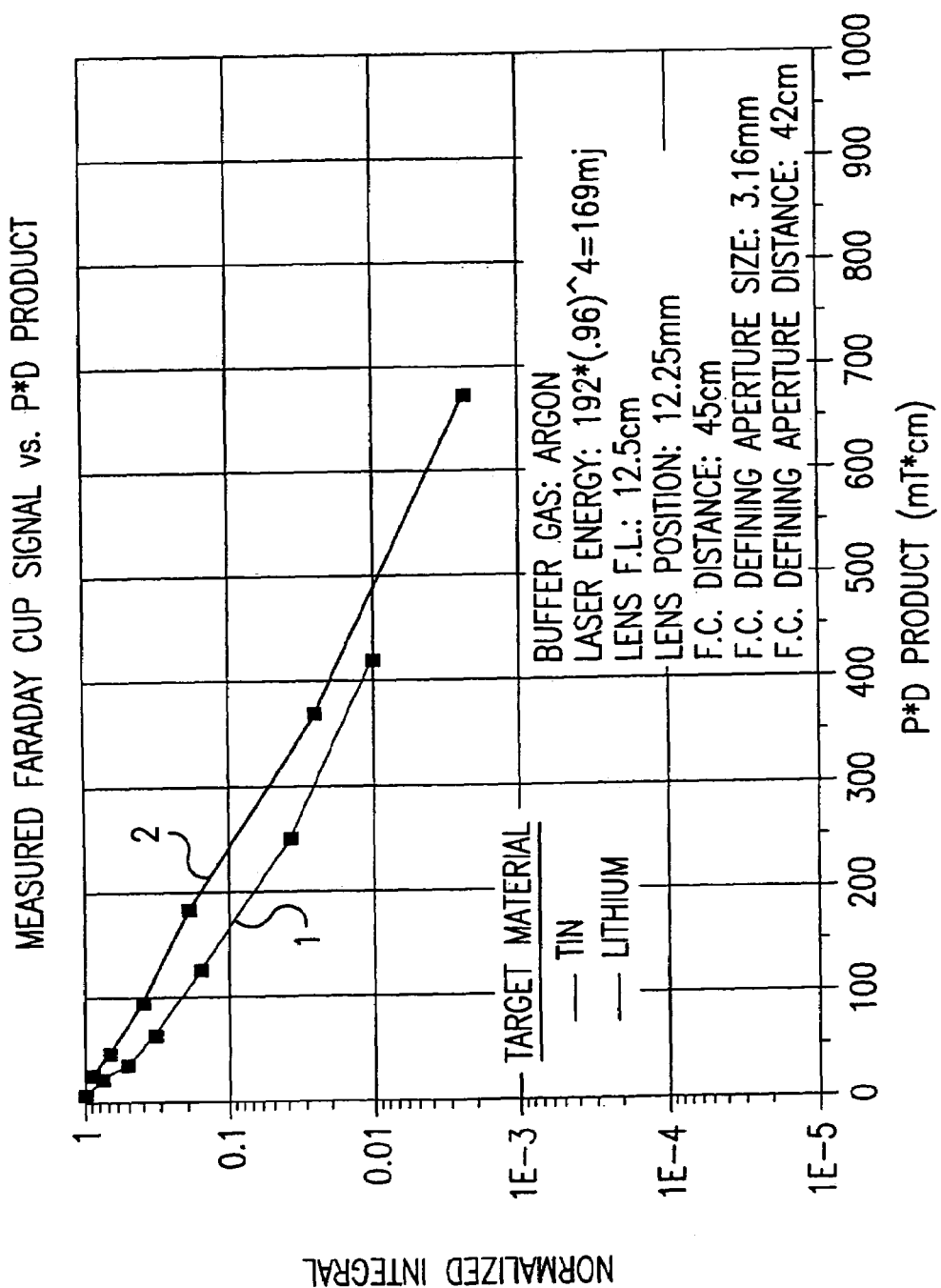

In continuing to examine the stopping power of a buffer against, e.g., the fast ions produced by the LPP, using, e.g., a Faraday cup to collect and measure the ions at a known distance through a known aperture size at different increasing buffer gas pressure this Faraday cup signal decreased, giving a measure of the ion stopping power. The results for tin and lithium are shown below in FIGS. 22A-E. FIGS. 22A and 22B show the raw Faraday cup signal vs. time for, respectively tin and lithium. In FIGS. 22C and D these signals are plotted vs. ion energy using time-of-flight respectively for tin and lithium. In FIG. 22E the area under these curves is plotted vs. a pressure*distance product of the buffer gas, with the lower plot line (1) being tin and the upper (2) being lithium.

A surprising result of this analysis by applicants was that the last graph shows the Faraday cup signal vs. buffer gas P*D product for both tin and lithium being about the same for both elements. Applicants believe this is explainable in that the analysis was not really measuring the loss of ions captured by the Faraday cup, but instead was measuring the neutralization of the ions by the buffer gas, so-called electron capture by the ions. If an ion is neutralized, it will not register in the Faraday cup. This can be explained, e.g., because tin might have a larger electron capture cross-section than lithium, especially considering that the tin ion is highly charged, 7-11 times ionized and the lithium can, at most, be 3 times ionized. The stopping power result shown in FIG. 22E can be considered an overestimate of the buffer gas stopping power in that it can be no better than the value predicted by these curves.

Taking the observed values of the stopping power as the upper limit one can calculate the necessary pressure of argon buffer gas to extend the collector mirror lifetime to 100 B pulses. Starting with the result from Engineering Test Stand (ETS) built by the EUV LLC, which reported that one multi-layer mirror pair is eroded for every 15 M pulses with a xenon LPP and a collector distance of 12 cm, and assuming that the reflectivity of a multi-layer mirror is not significantly degraded until 10 layer pairs are removed, the ETS collector mirror had a lifetime of 150M pulses compared to a requirement of 100 B pulses. This leads to the conclusion that a reduction of 666 X in erosion rate is necessary. On the plot in FIG. 22E a P*D product of approximately 500 mT*cm would be required to achieve this level of reduction.

A working distance of, e.g., 12 cm gives, e.g., a need for an argon pressure of 42 mT. This also can result in the conclusion that lithium is the better target over, e.g., xenon, since for xenon LPP, a buffer pressure of 42 mT is not very satisfactory due to the strong EUV absorption of the xenon caught up in the argon buffer. For lithium, however, this amount of buffer pressure is no problem for lithium absorption. Tin may also be satisfactory, depending on, e.g., the vapor pressure and evolution rate of SnH4 from the surface of the collector mirror. A relatively large buffer gas pressure seems, therefore, to be a requirement, which leads to the conclusion that xenon is not a good target, tin may be, but lithium appears to be the best.

Applicants have also determined that even if the effectiveness of heating the collector reflective surfaces is impacted by the fact that the material being evaporated needs to have, e.g., a certain thickness, e.g., 50 Å, e.g., about 10 monolayers, before published values of vapor pressure are realized, i.e., the material, e.g., lithium may be harder to evaporate directly off of the surface of the mirror, nevertheless, the transmittance of such a thickness of lithium on the mirror surfaces is about 95%, and about 90%, double-pass, so that such a layer on the mirror would not significantly detract from the overall CE, e.g., at 13.5 nm. In addition, such a layer of "evaporationless" lithium, may actually be beneficial in that it may be able to protect the collector mirror from the onslaught of high-speed lithium atoms and ions. This lithium layer will be sputtered instead of the molybdenum layer of the multi-layer mirror. Xenon, because it is a gas, will not form such a protective layer and a tin layer, because of its very high EUV absorption, would only be 52% transmitting.

Given that the sputter yield of lithium against molybdenum is much less than the sputter yield of xenon against molybdenum, e.g., for ion energies around 1 keV (the sputter rates tend to saturate above this energy level):

| Target Material | Incident Ion | |
| --- | --- | --- |
| | Lithium | Xenon |
| Lithium | 0.21 | ?? |
| Molybdenum | 0.081 | 1.45 | xenon will sputter molybdenum at 18 times higher rate than lithium. This difference alone would give a 2.7 B pulse collector lifetime without changing anything else. The "evaporationless" steady state thin layer of lithium may provide the remaining 37 X reduction in sputter rate. Even if it does not, the EUV LLC concept of producing a mirror with ~100 extra sacrificial layer pairs could add a 10× increase in lifetime, e.g., to 27 B pulses, which combined with the lower erosion from lithium could give a collector lifetime of 100 B pulses.

Applicants have also examined the effectiveness of electrostatic protection of the collector mirror. The concept has been proposed in the literature, i.e., to generate an electric field between the source LPP and the collector mirror such that the energetic ions must climb up a potential well as they travel toward the mirror. This potential well can be made deep enough that the ions loose all of their kinetic energy before reaching the mirror. In fact, they are turned around and sent packing back down the potential well, never reaching the mirror. Applicants have discovered, however, that attempting to do this by running an electrical connection through the vessel to the collector mirror was ineffective due to the target bias dropping to near zero upon pulsing the laser, which was determined to be the result of a high peak current required to maintain the bias voltage and the large lead wire required, thus dropping all of the voltage along the inductance of the wire. To correct this problem applicants then installed capacitors inside the vacuum vessel and constructed low inductance buss work between ground and the target plate. Inductance was measured by placing a copper sheet up and around the target and attached to ground. By charging the capacitors to a low voltage and discharging them by pressing the copper sheet against the target applicants measured the ringing voltage waveshape and inferred the inductance. The result was 104 nH with a 697 ns half-period discharge waveshape. This discharge period is much longer than the laser pulse and subsequent EUV emission initially causing concern whether the bias could be maintained during the critical period when the ions are created and leave the plasma region (~20 ns). Applicants determined, however, that such short time scales were unimportant. What is important is, e.g., to maintain or reestablish the target bias, e.g., in a time scale that is, e.g., short compared with the travel time of the ions from the target to the mirror. With the present geometries the ion travel time is about 2.5 µs, so a circuit half-period of 0.7 µs should be sufficient.

In testing this arrangement applicants were surprised to find that the full 0.47 µF capacitance was drained of its −1000V potential in a time scale almost exactly the same as during the inductance measurement using the copper strap. Applicants determined that the laser pulse initiates a discharge between the target plate and the vessel wall. This discharge completes the circuit between the capacitor's high voltage terminal and ground, thus draining the capacitors as if a copper strap had been placed across them. Evidently, the events that unfold during, and immediately after, the laser pulse, a plasma being created at the target point and this plasma radiating a large amount of hard UV and EUV radiation throughout the vessel. The energy of most of these photons is above the work function of the metals inside the vessel and thus photoelectrons are created at all the metal surfaces. These photons are also energetic enough to ionize any gas atoms that exist in the vessel. In this case argon was used as the buffer gas and it is easily ionized by the hard UV and EUV radiation produced by the LPP. And finally, electrons and ions are created in the LPP and stream outward into the volume of the vessel. Except for those ions that are attracted to the biased target plate. They strike the plate and create secondary electrons. Essentially, the creation of a discharge between two metal plates held at a potential between each other occurs as if the arrangement were a laser-triggered discharge switch.

There still is some possibility of making an effective electrostatic repulsion, but it becomes a bit more complicate and isn't really electrostatic. The idea is to pulse the bias such that it is present only after the initial events of the laser pulse. In only a few 100's of ns most of the electrons will have collided with the vessel wall, and of course the radiation will be gone. At this time it might be possible to apply a bias and repel, or attract, the ions away from the collector mirror.

It will be understood by those skilled in the art that an apparatus and method is disclosed which may comprise, a multi-layer reflecting coating forming an EUV reflective surface which may comprise an inter-diffusion barrier layer which may comprise a carbide selected from the group ZrC and NbC or a boride selected from the group $ZrB_2$ and $NbB_2$ or a disilicide selected from the group $ZrSi_2$ and $NbSi_2$ or a nitride selected from the group BN, ZrN, NbN, BN, ScN and $Si_3N_4$. The apparatus and method may comprise an EUV light source collector which may comprise a collecting mirror which may comprise a normal angle of incidence multi-layer reflecting coating; an inter-diffusion barrier layer comprising a material selected from the group comprising a carbide selected from the group ZrC and NbC, or a boride selected from the group $ZrB_2$ and $NbB_2$ or a disilicide selected from the group $ZrSi_2$ and $NbSi_2$ a nitride selected from the group BN, ZrN, NbN, BN, ScN and $Si_3N_4$. The multi-layer reflecting coating may comprise a capping layer which may comprise ruthenium. The multilayer reflecting coating may comprise multiple alternating layers of an absorber and a separator. The absorber may comprise molybdenum and the separator may comprise silicon. The capping layer may comprise molybdenum. The sputter thickness rate for sputtering of the capping layer material by material comprising a plasma production material may be at or below a rate that will result in the capping layer material sustaining such sputtering for greater than a selected lifetime. The multi-layer reflecting coating may comprise a capping layer which may comprise a material other than the absorber material and the separator material selected to have a sputter thickness rate that will sustain sputtering by a material comprising a plasma production material at or below a rate that will result in a single layer of the capping layer material sustaining such sputtering for greater than a selected time and to have more favorable properties when exposed to ambient or operating environments than those of the absorber material or the separator material. The multi-layer reflecting coating may comprise multiple alternating layers which may comprise a multi-layer mirror optimized for a selected nominal center wavelength in the EUV range. The apparatus and method may comprise a multi-layer reflecting coating forming an EUV reflective surface which may comprise an inter-diffusion barrier layer comprising yttrium, scandium or strontium. The apparatus and method may comprise an EUV light source collector which may comprise a collecting mirror which may comprise a normal angle of incidence multi-layer reflecting coating; an inter-diffusion barrier layer comprising a material comprising yttrium, scandium or strontium. The multilayer reflecting coating may comprise multiple alternating layers which may comprise $MoSi_2/Si$ or $Mo_2C/Si$, with or without an inter-diffusion barrier layer or inter-diffusion barrier layers. The multilayer reflecting coating may comprise multiple alternating layers which may comprise Mo/X/Si/X where X may comprise an inter-diffusion barrier layer which may comprise C or a carbide selected from the group ZrC and NbC, or a boride selected from the group $ZrB_2$ and $NbB_2$, or a disilicide selected from the group $ZrSi_2$ and $NbSi_2$ or a nitride selected from the group BN, ZrN, NbN, BN, ScN and $Si_3N_4$.

Those skilled in the art will appreciate that the above references preferred embodiments of the disclosed subject matter and aspects thereof are not meant to be exclusive and other modifications and additions to the above referenced embodiments may be made without departing from the spirit and scope of the inventions disclosed in the present application. The appended claims, therefore, should not be considered to be limited to the above disclosed embodiments and aspects but should include with the scope and spirit of the claims the recited elements and equivalents of the recited elements. By way of example, other target material and multi-layer reflective coating metals may have similar relationships as discussed above to allow for the continuous cleaning by, e.g., sputtering, e.g., of ions, e.g., induced by the creation of a sputtering plasma in the vicinity of the optic reflecting surface(s), which ions may also be, e.g., other than helium, e.g., H, N or O. Also, e.g., the heating mechanism for the reflecting surface could be a heat lamp directed at the reflective surface. Other such changes and additions may be appreciated by those skilled in the art.

While the particular aspects of embodiment(s) of the {TITLE} described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the subject matter claimed are merely exemplary, illustrative and representative of the subject matter which is broadly contemplated by the claimed subject matter. The scope of the presently described and claimed aspects of embodiments fully encompasses other embodiments which may now be or may become obvious to those skilled in the art based on the teachings of the Specification. The scope of the present [TITLE] is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act."

It will be understood also be those skilled in the art that, in fulfillment of the patent statutes of the United States, Applicant(s) has disclosed at least one enabling and working embodiment of each invention recited in any respective claim appended to the Specification in the present application and perhaps in some cases only one. For purposes of cutting down on patent application length and drafting time and making the present patent application more readable to the inventor(s) and others, Applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "using," "taking," "keeping," "making," "determining," "measuring," "calculating" or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, component, sub-component, process or algorithm step, particular material, or the like, it should be read, for purposes of interpreting the scope of the subject matter of what applicant(s) has invented, and claimed, to be preceded by one or more, or all, of the following limiting phrases, "by way of example," "for example," "as an example," "illustratively only," "by way of illustration only," etc., and/or to include any one or more, or all, of the phrases "may be," "can be", "might be," "could be" and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, Applicant(s) has disclosed only a single enabling example of any such aspect/feature/element of an embodiment or of any embodiment of the subject matter of what is claimed. Unless expressly and specifically so stated in the present application or the prosecution of this application, that Applicant(s) believes that a particular aspect/feature/element of any disclosed embodiment or any particular disclosed embodiment of the subject matter of what is claimed, amounts to the one an only way to implement the subject matter of what is claimed or any aspect/feature/element recited in any such claim, Applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

I claim:

1. An apparatus comprising:
a multi-layer reflecting coating forming an EUV reflective surface comprising:
an inter-diffusion barrier layer comprising a carbide selected from the group ZrC and NbC.

2. The apparatus of claim 1 further comprising:
a capping layer comprising ruthenium.

3. The apparatus of claim 2 further comprising:
the sputter thickness rate for sputtering of the capping layer material by material comprising a plasma production material is at or below a rate that will result in the capping layer material sustaining such sputtering for greater than a selected lifetime.

4. The apparatus of claim 1 further comprising:
the multilayer reflecting coating comprising multiple alternating layers of an absorber and a separator.

5. The apparatus of claim 4 further comprising:
the absorber comprising molybdenum and the separator comprising silicon.

6. The apparatus of claim 4 further comprising:
the multi-layer reflecting coating comprising a capping layer comprising a material other than the absorber material and the separator material selected to have a sputter thickness rate that will sustain sputtering by a material comprising a plasma production material at or below a rate that will result in a single layer of the capping layer material sustaining such sputtering for greater than a selected time and to have more favorable properties when exposed to ambient or operating environments than those of the absorber material or the separator material.

7. The apparatus of claim 1 further comprising:
a capping layer comprising molybdenum.

8. The apparatus of claim 7 further comprising:
the sputter thickness rate for sputtering of the capping layer material by material comprising a plasma production material is at or below a rate that will result in the capping layer material sustaining such sputtering for greater than a selected lifetime.

9. The apparatus of claim 1 further comprising:
the sputter thickness rate for sputtering of a capping layer material by material comprising a plasma production material is at or below a rate that will result in the capping layer material sustaining such sputtering for greater than a selected lifetime.

10. The apparatus of claim 1 further comprising:
the multilayer reflecting coating comprising multiple alternating layers comprising a multi-layer mirror optimized for a selected nominal center wavelength in the EUV range.

11. The apparatus of claim 1 further comprising:
the multilayer reflecting coating comprising multiple alternating layers comprising $MoSi_2/Si$ or $Mo_2C/Si$, with or without an inter-diffusion barrier layer or inter-diffusion barrier layers.

12. The apparatus of claim 1 further comprising:
the multilayer reflecting coating comprising multiple alternating layers comprising Mo/X/Si/X where X comprises an inter-diffusion barrier layer comprising C or a carbide selected from the group ZrC and NbC.

13. An apparatus comprising:
a multi-layer reflecting coating forming an EUV reflective surface comprising:
an inter-diffusion barrier layer comprising a boride selected from the group $ZrB_2$ and $NbB_2$.

14. The apparatus of claim 13 further comprising:
a capping layer comprising ruthenium.

15. The apparatus of claim 14 further comprising:
the sputter thickness rate for sputtering of the capping layer material by material comprising a plasma production material is at or below a rate that will result in the capping layer material sustaining such sputtering for greater than a selected lifetime.

16. The apparatus of claim 13 further comprising:

the multilayer reflecting coating comprising multiple alternating layers of an absorber and a separator.

17. The apparatus of claim 16 further comprising:
the absorber comprising molybdenum and the separator comprising silicon.

18. The apparatus of claim 16 further comprising:
the multi-layer reflecting coating comprising a capping layer comprising a material other than the absorber material and the separator material selected to have a sputter thickness rate that will sustain sputtering by a material comprising a plasma production material at or below a rate that will result in a single layer of the capping layer material sustaining such sputtering for greater than a selected time and to have more favorable properties when exposed to ambient or operating environments than those of the absorber material or the separator material.

19. The apparatus of claim 13 further comprising:
a capping layer comprising molybdenum.

20. The apparatus of claim 19 further comprising:
the sputter thickness rate for sputtering of the capping layer material by material comprising a plasma production material is at or below a rate that will result in the capping layer material sustaining such sputtering for greater than a selected lifetime.

21. The apparatus of claim 13 further comprising:
the sputter thickness rate for sputtering of a capping layer material by material comprising a plasma production material is at or below a rate that will result in the capping layer material sustaining such sputtering for greater than a selected lifetime.

22. The apparatus of claim 13 further comprising:
the multilayer reflecting coating comprising multiple alternating layers comprising a multi-layer mirror optimized for a selected nominal center wavelength in the EUV range.

23. The apparatus of claim 13 further comprising:
the multilayer reflecting coating comprising multiple alternating layers comprising $MoSi_2/Si$ or $Mo_2C/Si$, with or without an inter-diffusion barrier layer or inter-diffusion barrier layers.

24. The apparatus of claim 13 further comprising:
the multilayer reflecting coating comprising multiple alternating layers comprising Mo/X/Si/X where X comprises an inter-diffusion barrier layer comprising C or a boride selected from the group $ZrB_2$ and $NbB_2$.

25. An apparatus comprising:
a multi-layer reflecting coating forming an EUV reflective surface comprising:
an inter-diffusion barrier layer comprising a disilicide selected from the group $ZrSi_2$ and $NbSi_2$.

26. The apparatus of claim 25 further comprising:
a capping layer comprising ruthenium.

27. The apparatus of claim 26 further comprising:
the sputter thickness rate for sputtering of the capping layer material by material comprising a plasma production material is at or below a rate that will result in the capping layer material sustaining such sputtering for greater than a selected lifetime.

28. The apparatus of claim 25 further comprising:
the multilayer reflecting coating comprising multiple alternating layers of an absorber and a separator.

29. The apparatus of claim 28 further comprising:
the absorber comprising molybdenum and the separator comprising silicon.

30. The apparatus of claim 28, further comprising:
the multi-layer reflecting coating comprising a capping layer comprising a material other than the absorber material and the separator material selected to have a sputter thickness rate that will sustain sputtering by a material comprising a plasma production material at or below a rate that will result in a single layer of the capping layer material sustaining such sputtering for greater than a selected time and to have more favorable properties when exposed to ambient or operating environments than those of the absorber material or the separator material.

31. The apparatus of claim 25 further comprising:
a capping layer comprising molybdenum.

32. The apparatus of claim 31 further comprising:
the sputter thickness rate for sputtering of a capping layer material by material comprising a plasma production material is at or below a rate that will result in the capping layer material sustaining such sputtering for greater than a selected lifetime.

33. The apparatus of claim 25 further comprising:
the sputter thickness rate for sputtering of a capping layer material by material comprising a plasma production material is at or below a rate that will result in the capping layer material sustaining such sputtering for greater than a selected lifetime.

34. The apparatus of claim 25 further comprising:
the multilayer reflecting coating comprising multiple alternating layers comprising a multi-layer mirror optimized for a selected nominal center wavelength in the EUV range.

35. The apparatus of claim 25 further comprising:
the multilayer reflecting coating comprising multiple alternating layers comprising $MoSi_2/Si$ or $Mo_2C/Si$, with or without an inter-diffusion barrier layer or inter-diffusion barrier layers.

36. The apparatus of claim 25 further comprising:
the multilayer reflecting coating comprising multiple alternating layers comprising Mo/X/Si/X where X comprises an inter-diffusion barrier layer comprising C or a disilicide selected from the group $ZrSi_2$ and $NbSi_2$.

37. An apparatus comprising:
a multi-layer reflecting coating forming an EUV reflective surface comprising:
an inter-diffusion barrier layer comprising a nitride selected from the group BN, ZrN, NbN, BN, ScN and $Si_3N_4$.

38. The apparatus of claim 37 further comprising:
a capping layer comprising ruthenium.

39. The apparatus of claim 37 further comprising:
the multilayer reflecting coating comprising multiple alternating layers of an absorber and a separator.

40. The apparatus of claim 39 further comprising:
the absorber comprising molybdenum and the separator comprising silicon.

41. The apparatus of claim 39, further comprising:
the multi-layer reflecting coating comprising a capping layer comprising a material other than the absorber material and the separator material selected to have a sputter thickness rate that will sustain sputtering by a material comprising a plasma production material at or below a rate that will result in a single layer of the capping layer material sustaining such sputtering for greater than a selected time and to have more favorable properties when exposed to ambient or operating environments than those of the absorber material or the separator material.

42. The apparatus of claim 37 further comprising:

a capping layer comprising molybdenum.

43. The apparatus of claim 42 further comprising:
the sputter thickness rate for sputtering of a capping layer material by material comprising a plasma production material is at or below a rate that will result in the capping layer material sustaining such sputtering for greater than a selected lifetime.

44. The apparatus of claim 37 further comprising:
the sputter thickness rate for sputtering of a capping layer material by material comprising a plasma production material is at or below a rate that will result in the capping layer material sustaining such sputtering for greater than a selected lifetime.

45. The apparatus of claim 37 further comprising:
the multilayer reflecting coating comprising multiple alternating layers comprising a multi-layer mirror optimized for a selected nominal center wavelength in the EUV range.

46. The apparatus of claim 37 further comprising:
the multilayer reflecting coating comprising multiple alternating layers comprising $MoSi_2/Si$ or $Mo_2C/Si$, with or without an inter-diffusion barrier layer or inter-diffusion barrier layers.

47. The apparatus of claim 37 further comprising:
the multilayer reflecting coating comprising multiple alternating layers comprising Mo/X/Si/X where X comprises an inter-diffusion barrier layer comprising C or a nitride selected from the group BN, ZrN, NbN, BN, ScN and $Si_3N_4$.

48. An apparatus comprising:
an EUV light source collector comprising:
a collecting mirror comprising a normal angle of incidence multi-layer reflecting coating;
an inter-diffusion barrier layer comprising a material selected from the group comprising a carbide selected from the group ZrC and NbC, or a boride selected from the group $ZrB_2$ and $NbB_2$ or a disilicide selected from the group $ZrSi_2$ and $NbSi_2$ or a nitride selected from the group BN, ZrN, NbN, BN, ScN and $Si_3N_4$.

49. The apparatus of claim 48 further comprising:
the sputter thickness rate for sputtering of a capping layer material by material comprising a plasma production material is at or below a rate that will result in the capping layer material sustaining such sputtering for greater than a selected lifetime.

50. An apparatus comprising:
a multi-layer reflecting coating forming an EUV reflective surface comprising:
an inter-diffusion barrier layer comprising yttrium, scandium or strontium.

51. An apparatus comprising:
an EUV light source collector comprising:
a collecting mirror comprising a normal angle of incidence multi-layer reflecting coating;
an inter-diffusion barrier layer comprising a material comprising yttrium, scandium or strontium.

* * * * *